(12) United States Patent
Meinel et al.

(10) Patent No.: US 9,157,807 B2
(45) Date of Patent: Oct. 13, 2015

(54) ETCHING CAVITY STRUCTURES IN SILICON UNDER DIELECTRIC MEMBRANE

(75) Inventors: Walter B. Meinel, Tucson, AZ (US); Kalin V. Lazarov, Tucson, AZ (US); Brian E. Goodlin, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 633 days.

(21) Appl. No.: 12/456,910

(22) Filed: Jun. 24, 2009

(65) Prior Publication Data
US 2010/0327393 A1 Dec. 30, 2010

(51) Int. Cl.
*G01J 5/12* (2006.01)
*B81C 1/00* (2006.01)
*G01J 5/02* (2006.01)

(52) U.S. Cl.
CPC .............. *G01J 5/12* (2013.01); *B81C 1/00047* (2013.01); *G01J 5/02* (2013.01); *G01J 5/024* (2013.01); *G01J 5/0225* (2013.01); *B81B 2201/0292* (2013.01)

(58) Field of Classification Search
CPC . H01L 21/76; H01L 21/764; H01L 21/76289; H01L 21/67248; H01L 23/5387; H01L 2924/1461
USPC .................... 257/54, 467, 470, 618, E29.002, 257/E29.347
See application file for complete search history.

(56) References Cited

U.S. PATENT DOCUMENTS

| | | | |
|---|---|---|---|
| 5,589,689 A | 12/1996 | Koskinen | |
| 5,594,172 A * | 1/1997 | Shinohara | 73/514.33 |
| 6,300,632 B1 | 10/2001 | Liu et al. | |
| 6,345,238 B1 | 2/2002 | Goodwin et al. | |
| 6,509,210 B2 * | 1/2003 | Park et al. | 438/131 |
| 6,673,593 B2 * | 1/2004 | Mastromatteo et al. | 435/283.1 |
| 6,677,654 B2 | 1/2004 | Kim et al. | |
| 6,787,052 B1 * | 9/2004 | Vaganov | 216/57 |
| 6,828,560 B2 | 12/2004 | Lambert et al. | |
| 7,754,517 B2 * | 7/2010 | Iinuma | 438/54 |
| 7,951,721 B2 * | 5/2011 | Landsberger et al. | 438/704 |
| 2002/0148807 A1 * | 10/2002 | Zhao et al. | 216/2 |
| 2003/0146384 A1 | 8/2003 | Logsdon et al. | |
| 2004/0113076 A1 | 6/2004 | Guo et al. | |
| 2005/0186751 A1 | 8/2005 | Beach et al. | |
| 2006/0062439 A1 | 3/2006 | Setlak | |
| 2006/0238292 A1 | 10/2006 | Beach et al. | |
| 2007/0298534 A1 * | 12/2007 | Ikushima et al. | 438/57 |
| 2008/0048298 A1 * | 2/2008 | Taylor et al. | 257/618 |

(Continued)

OTHER PUBLICATIONS

"Investigation of Thermopile Using CMOS Compatible Process and Front-Side Si Bulk Etching" by Chen-Hsun-Du and Chengkuo Lee, Proceedings of SPIE vol. 4176 (2000), pp. 168-178.

(Continued)

*Primary Examiner* — Jerome Jackson, Jr.
*Assistant Examiner* — Paul Budd
(74) *Attorney, Agent, or Firm* — Alan A. R. Cooper; Frank D. Cimino

(57) ABSTRACT

A semiconductor device includes a semiconductor layer (2) and a dielectric stack (3) on the semiconductor layer. A plurality of etchant openings (24-1,2 . . . ) are formed through the dielectric stack (3) for passage of etchant for etching a plurality of overlapping sub-cavities (4-1,2 . . . ), respectively. The etchant is introduced through the etchant openings to etch a composite cavity (4) in the semiconductor layer by simultaneously etching the plurality of overlapping sub-cavities into the semiconductor layer.

11 Claims, 20 Drawing Sheets

(56) References Cited

U.S. PATENT DOCUMENTS

| | | |
|---|---|---|
| 2008/0179503 A1 | 7/2008 | Camargo et al. |
| 2008/0317087 A1 | 12/2008 | Kimura |
| 2009/0134330 A1 | 5/2009 | Huppertz |
| 2009/0151429 A1* | 6/2009 | Jun et al. ............... 73/31.06 |
| 2009/0250784 A1 | 10/2009 | Meinel et al. |
| 2010/0213374 A1* | 8/2010 | Meinel et al. ............. 250/338.4 |
| 2010/0289108 A1* | 11/2010 | Meinel et al. ............. 257/467 |
| 2010/0327393 A1 | 12/2010 | Meinel et al. |
| 2011/0147869 A1 | 6/2011 | Lazarov et al. |

OTHER PUBLICATIONS

"Micro-Heater on Membrane with Large Uniform-Temperature Area" by Li et al., IEEE Sensors 2006, EXCO, Daegu, Korea, Oct. 22-25, 2006, pp. 571-575.

U.S. Appl. No. 12/380,316, filed Feb. 26, 2009.

"MLX90614 Family: Single and Dual Zone Infra Red Thermometer in TO-39," Data Sheet, Jul. 30, 2008, pp. 1-42 (Microelectronic Integrated Systems (Melexis).

* cited by examiner

ETCHING CAVITY STRUCTURES IN SILICON UNDER DIELECTRIC MEMBRANE

BACKGROUND OF THE INVENTION

The present invention relates generally to structures and methods for strengthening/supporting dielectric membranes which extend over the over cavities in integrated circuit devices, and more particularly to use of various sizes, shapes, and relative locations of etchant openings in the dielectric membranes through which to introduce etchant for etching the cavities.

This invention is closely related to the assignee's pending application "INFRARED SENSOR STRUCTURE AND METHOD" by Walter B. Meinel and Kalin V. Lazarov, Ser. No. 12/380,316, filed Feb. 26, 2009, and incorporated herein by reference.

Integrated semiconductor sensors can make use of $SiO_2$ membrane structures which extend from, or "overhang" from, a silicon base or the like, for example, to cover a cavity etched into the silicon base. Such membrane structures tend to be fragile and therefore susceptible to damage during assembly operations which occur after formation of the membrane structures. For example, to achieve maximum sensitivity, the cavity openings covered by the $SiO_2$ membrane in the infrared sensors described in the above mentioned Meinel et al. application should be as large as possible, but unfortunately this causes the $SiO_2$ membrane to be more fragile.

The closest prior art is believed to include the article "Investigation Of Thermopile Using CMOS Compatible Process and Front-Side Si Bulk Etching" by Chen-Hsun-Du and Chengkuo Lee, Proceedings of SPIE Vol. 4176 (2000), pp. 168-178, incorporated herein by reference. Infrared thermopile sensor physics and measurement of IR radiation using thermopiles are described in detail in this reference. Prior Art FIG. 1 herein shows the CMOS-processing-compatible IR sensor integrated circuit chip in FIG. 1 of the foregoing article. "Prior Art" FIG. 1 herein is similar to drawing, and Prior FIG. 1B herein shows the top perspective view of the same IR sensor integrated circuit chip illustrated in FIG. 2 of the foregoing article.

Referring to Prior Art FIG. 1A herein, the IR sensor chip includes a silicon substrate 2 having a CMOS-processing-compatible dielectric ($SiO_2$) stack 3 thereon including a number of distinct sub-layers. A N-type polysilicon (polycrystalline silicon) trace 11 and an aluminum trace M1 in dielectric stack 3 form a first "thermopile junction" where one end of the polysilicon trace and one end of the aluminum trace are connected. Additional oxide layers and additional metal traces also may be included in dielectric stack 3. An oxide passivation layer 12A is formed on top of dielectric stack 3, and a nitride passivation layer 12B is formed on oxide passivation layer 12A. A number of silicon etchant openings 24 extend through nitride passivation layer 12 and dielectric stack 3 to the top surface of silicon substrate 2 and are used to etch a cavity 4 in silicon substrate 2 underneath the portion of dielectric stack 3 in which the thermopile is formed, to thermally isolate it from silicon substrate 2.

Prior Art FIG. 1A is taken along section line 1A-1A of Prior Art FIG. 1B, which is essentially similar to FIG. 2 of the above mentioned Du and Lee reference. Cavity 4 is etched underneath $SiO_2$ stack 3 by means of silicon etchant introduced through the various etchant openings 24, which are relatively large and irregular. FIG. 1B shows various metal-polysilicon strips MP1 each of which includes an aluminum strip M1 and a polysilicon strip 11 which makes electrical contact to the aluminum strip M1 as shown in FIG. 1B. The metal strips M1 run parallel to the polysilicon strips 11 and, except for the electrical contact between them as shown in FIG. 1A, are separated from polysilicon strips 11 by a sublayer of $SiO_2$ stack 3. Although not shown in FIG. 1A, the dielectric material directly above metal strips M1 actually has corresponding steps which are indicated by reference numerals MP2 in FIG. 1B. The relatively large etchant openings 24 and their various angular shapes cause the "floating" membrane consisting of the various metal-polysilicon strips MP1 and the central section 3A of $SiO_2$ stack 3 supported by metal-polysilicon strips MP1 to be very fragile. Such fragility ordinarily results in an unacceptably large number of device failures during subsequent wafer fabrication, subsequent packaging, and ultimate utilization of the IR sensor of FIGS. 1A and 1B.

A second thermopile junction (not shown) is also formed in dielectric stack 3 directly over a silicon substrate 2 and is not thermally isolated from silicon substrate 2 and therefore is at the same temperature as silicon substrate 2. The first and second thermopile junctions are connected in series and form a single "thermopile". The various silicon etchant openings 24 are formed in regions in which there are no polysilicon or aluminum traces, as shown in the dark areas in FIG. 2 of the Du and Lee article.

Incoming IR radiation indicated by arrows 5 in Prior Art FIG. 1 impinges on the "front side" or "active surface" of the IR sensor chip. (The "back side" of the chip is the bottom surface of silicon substrate 2 as it appears in Prior Art FIG. 1.) The incoming IR radiation 5 causes the temperature of the thermopile junction supported on the "floating" portion of dielectric membrane 3 located directly above cavity 4 to be greater than the temperature of the second thermopile junction (not shown) in dielectric membrane 3 which is not insulated by cavity 4.

When performing silicon etching by introducing silicon etchant through openings in a dielectric layer of a semiconductor device wherein the etching undercuts the dielectric layer to provide a cavity underneath the dielectric layer, the resulting undercut dielectric membrane is very fragile and can be damaged during further processing of the semiconductor device. It also is desirable to be able to prevent dirt or fluids from entering into the cavity through openings. During subsequent wafer processing, a jet of water typically is directed onto the wafer surface to clean it during wafer sawing operations. This causes high stress in the $SiO_2$ membrane over the etched cavity. The high stress may exceed the $SiO_2$ membrane strength, and cavitation which occurs during the wafer sawing may further amplify the stresses therein. Cracks may propagate from high stress points in the $SiO_2$ membrane across portions thereof supporting conductors and/or other circuit elements fabricated within the $SiO_2$ membrane. Such cracks may result in integrated circuit device failure or unreliable device operation.

Furthermore, the performance of circuit elements fabricated within the dielectric membrane depends on having only air, which has a very low dielectric constant, underneath the dielectric membrane.

It would be highly desirable to provide integrated circuit devices which include fragile dielectric membranes that extend over cavities and which are more economical and more robust than those known in the prior art.

It is well-known that the upper limit of the operating frequency of an integrated circuit is often determined by the amount of parasitic capacitance associated with circuit elements such as resistors and/or capacitors and/or inductors therein. It would be very beneficial to be able to substantially lower such parasitic capacitance.

It would be highly desirable to provide integrated circuit devices which include fragile "cantilevered" dielectric membranes and which are more economical and more robust than those known in the prior art. It also would be highly desirable to provide robust integrated circuits that are operable at higher RF frequencies than previously have been economically achievable.

There is an unmet need for integrated circuit devices which include fragile "cantilevered" dielectric membranes and which are more robust than those known in the prior art.

There also is an unmet need for an IR radiation sensor which includes a fragile "cantilevered" dielectric membrane and which is more robust than those known in the prior art.

There also is an unmet need for a CMOS-processing-compatible IR radiation sensor chip which is substantially more robust than those of the prior art.

There also is an unmet need for an improved method of fabricating an IR radiation sensor.

There also is an unmet need for a robust, economical integrated circuit that is operable at higher RF frequencies than have been previously achievable for similar integrated circuits.

There also is an unmet need for a way of providing a circuit component having reduced parasitic capacitance in an integrated circuit.

There also is an unmet need for a way of providing a resistor and/or a capacitor and/or an inductor having reduced parasitic capacitance in an integrated circuit.

SUMMARY OF THE INVENTION

It is an object of the invention to provide integrated circuit devices which include fragile "cantilevered" dielectric membranes and which are more robust than those known in the prior art.

It is another object of the invention to provide an IR radiation sensor which includes a fragile "cantilevered" dielectric membrane and which is more robust than IR radiation sensors known in the prior art.

It is another object of the invention to provide a more accurate IR radiation sensor which includes a fragile "cantilevered" dielectric membrane and which is more robust than those known in the prior art.

It is another object of the invention to provide a CMOS-processing-compatible IR radiation sensor chip which is substantially more robust than those of the prior art.

It is another object of the invention to provide an improved method of fabricating an IR radiation sensor.

It is another object of the invention to provide a robust, economical integrated circuit that is operable at higher RF frequencies that have been previously achievable in similar integrated circuits.

It is another object of the invention to provide a circuit component having reduced parasitic capacitance in an integrated circuit.

It is another object of the invention to provide a resistor and/or a capacitor and/or an inductor having reduced parasitic capacitance in an integrated circuit.

Briefly described, and in accordance with one embodiment, the present invention provides a semiconductor device includes a semiconductor layer (2) and a dielectric stack (3) on the semiconductor layer. A plurality of etchant openings (24-1,2 . . . ) are formed through the dielectric stack (3) for passage of etchant for etching a plurality of overlapping sub-cavities (4-1,2 . . . ), respectively. The etchant is introduced through the etchant openings to etch a composite cavity (4) in the semiconductor layer by simultaneously etching the plurality of overlapping sub-cavities into the semiconductor layer.

In one embodiment, the invention provides a semiconductor device including a semiconductor layer (2) and dielectric layer (3) disposed on the semiconductor layer (2). A portion of the dielectric layer (3) extends over a composite cavity (4) in the semiconductor layer (2). The composite cavity (4) includes a plurality of overlapping sub-cavities (4-1,2 . . .). A plurality of etchant openings (24-1,2 . . .) extend through the dielectric layer (3) for passage of etchant for etching the plurality of sub-cavities (4-1,2 . . .), respectively. Diameters of the plurality of etchant openings (24) have values which correspond to diameters and depths of the plurality of sub-cavities (4-1,2 . . .), respectively. In one embodiment, the semiconductor device includes a plurality of sub-cavities (4-1,2) and a plurality of corresponding etchant openings (24-1,2). In one embodiment, a pitch between adjacent etchant openings (24-1,2 . . .) is in a range from 2 to 4 times a diameter of the etchant openings. In a described embodiment, a depth of the composite cavity (4) is approximately equal to a dimension across the composite cavity (4) divided by the number of the etchant openings (24-1,2 . . .) through which the etchant is introduced to etch the plurality of sub-cavities (4-1,2 . . .).

In a described embodiment, a diameter of the etchant openings (24-1, 2 . . . ) is in a range from approximately 10 microns to approximately 30 microns. In a described embodiment, the semiconductor layer (2) is composed of silicon and the dielectric layer (3) is composed of silicon dioxide. A cap layer (34) is disposed over the dielectric layer (3) for covering the etchant openings (24-1,2 . . . ) and strengthening the dielectric layer (3). In a described embodiment, a passivation layer (12) is disposed on the dielectric layer (3), and the etchant openings (24) extend through the passivation layer (12). In a described embodiment, the cap layer (34) is composed of roll-on epoxy film.

In a described embodiment, a first thermocouple junction (7) is included in a portion of the dielectric layer (3) extending over the cavity (4), and wherein a second thermocouple junction (8) is included in another portion of the dielectric layer (3) disposed directly on the semiconductor layer (2), the first (7) and second (8) thermocouple junctions being coupled to form a thermopile (7,8). In another described embodiment, a passive component (87,88,94) included in a portion of the dielectric layer (3) extending over the cavity (4) wherein a low dielectric constant in the cavity (4) results in low values of parasitic capacitance associated with the passive component. In another described embodiment, a pillar (25) of dielectric material extends from a bottom of the composite cavity (4) to engage and support a first surface of a portion of the dielectric layer (3) extending over the composite cavity (4), to thereby increase robustness of the semiconductor device.

In a described embodiment, the etchant openings (24-1, 2 . . . ) have circular cross-sections.

In one embodiment, the invention provides a method for making a semiconductor device, including providing a semiconductor layer (2), providing a dielectric stack (3) on the semiconductor layer (2), forming a plurality of etchant openings (24-1,2 . . . ) through the dielectric stack (3) for passage of etchant for etching a plurality of overlapping sub-cavities (4-1,2 . . . ), respectively, and introducing etchant through the etchant openings (24) to etch a composite cavity (4) in the semiconductor layer (2) by simultaneously etching the plurality of overlapping sub-cavities (4-1,2 . . . ) into the semiconductor layer (2).

In one embodiment, the method includes providing a passivation layer (12) on the dielectric stack (3), the etchant openings (24-1,2 . . . ) extending through the passivation layer (12), and providing a cap layer (34) on at least a portion of the passivation layer (12) over the dielectric stack (3) to cover the etchant openings (24-1,2 . . . ). In one embodiment, the method includes providing the cap layer (34) by rolling epoxy film over the dielectric stack (3) to cover the etchant openings (24-1,2 . . . ). In one embodiment, the method includes providing a pillar (25) of dielectric material extending from a bottom of the composite cavity (4) to engage and support a first surface of a portion of the dielectric layer (3) extending over the composite cavity (4), to thereby increase robustness of the semiconductor device.

In one embodiment, the invention provides a semiconductor device including a semiconductor layer (2), a dielectric stack (3) on the semiconductor layer (2), a plurality of overlapping sub-cavities (4-1,2 . . . ) in the semiconductor layer (2) forming a composite cavity therein, and means (24-1,2 . . . ) 4 introducing etchant through the dielectric stack (3) to simultaneously etch the plurality of overlapping sub-cavities (4-1, 2 . . . ).

DETAILED DESCRIPTION OF THE PREFERRED EMBODIMENTS

Figure 1A:
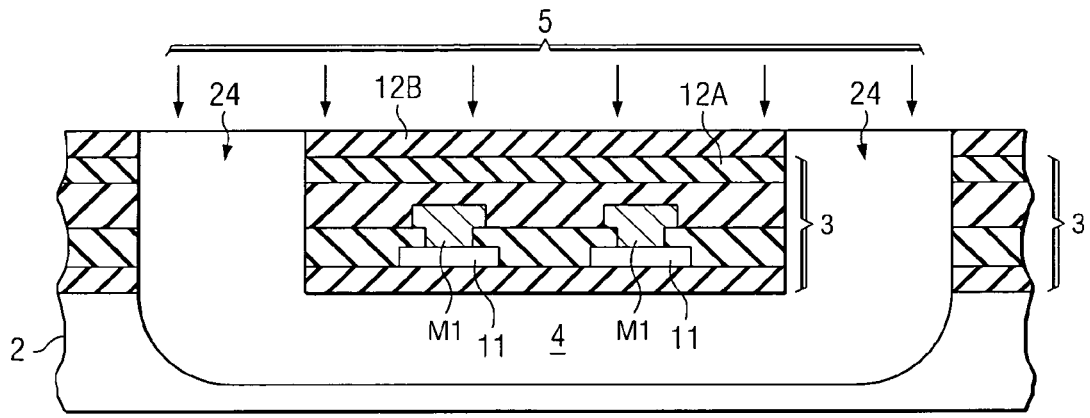
FIG. 1A is a section view diagram of a prior art IR radiation detector supported in a membrane formed in a CMOS-processing-compatible process, taken along section line 1A-1A of FIG. 1B.
Figure 1B:
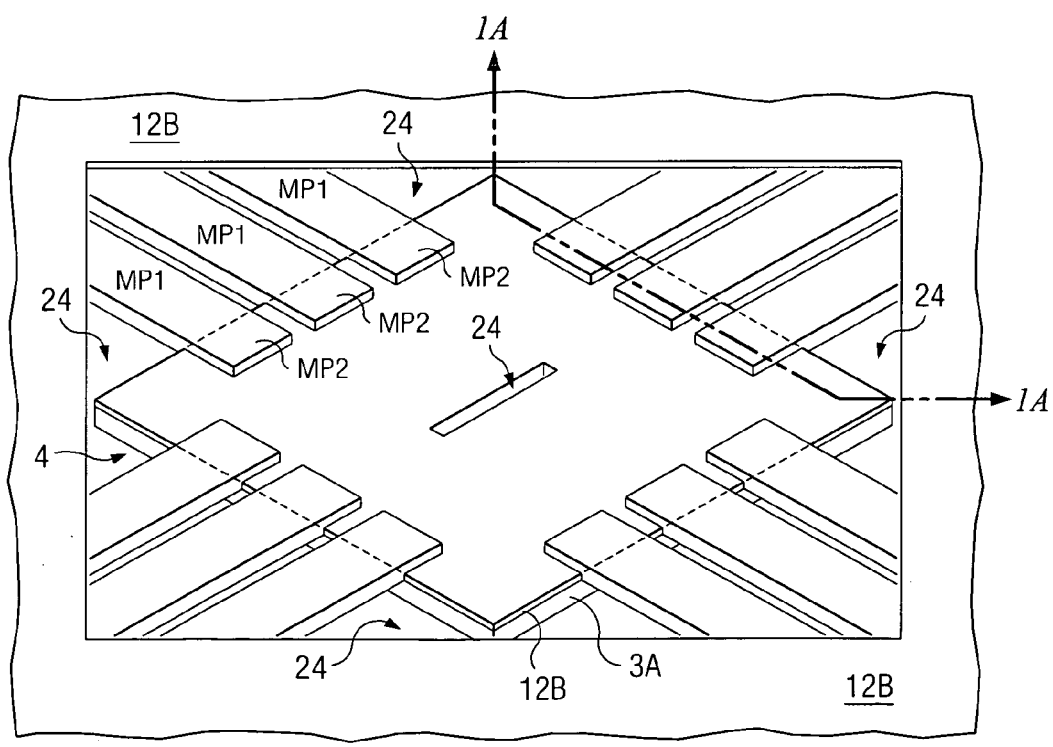
FIG. 1B is a top perspective view of the prior art IR radiation detector shown in FIG. 1A.
Figure 2A:
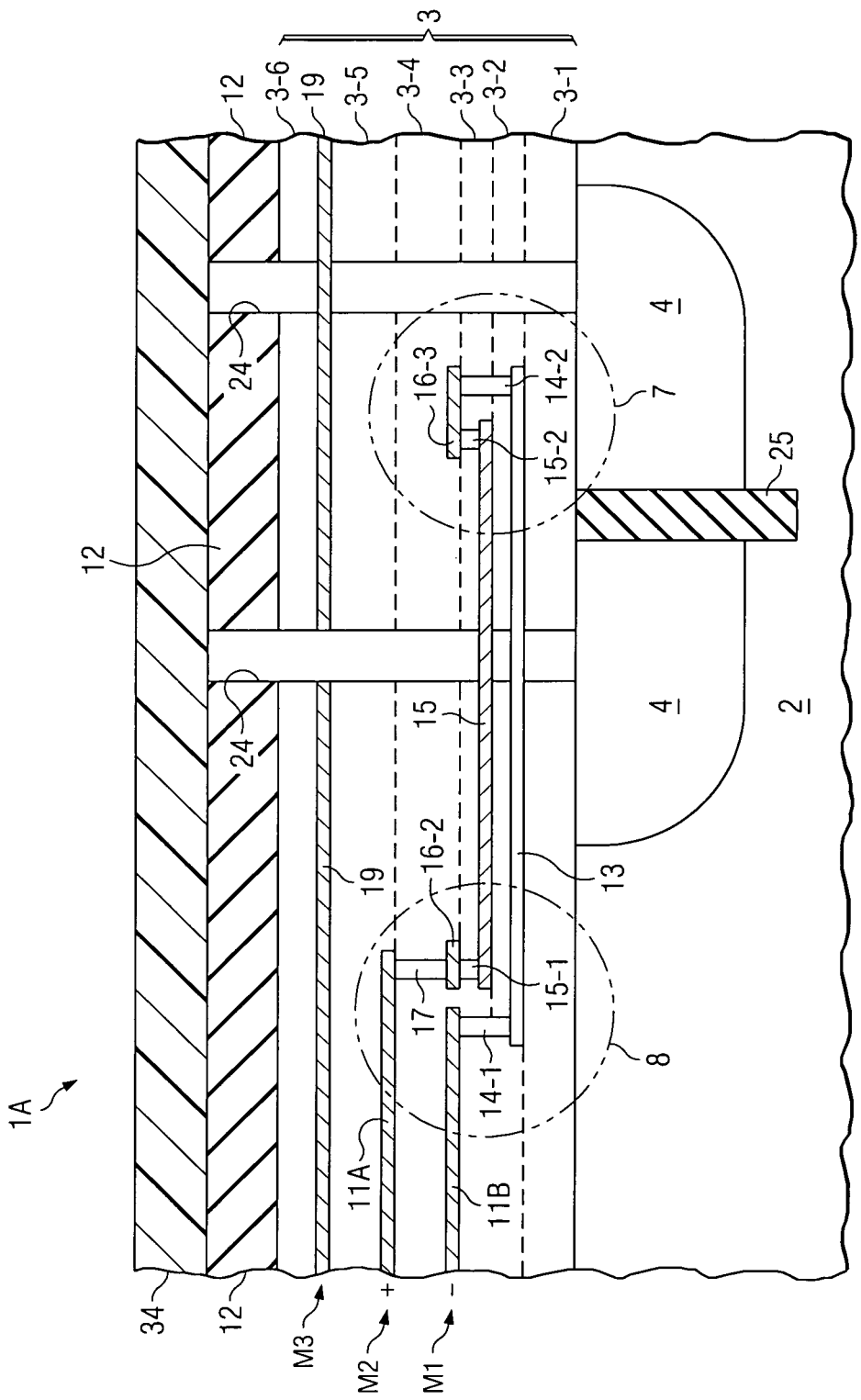
FIG. 2A is a section view of an IR sensor chip according to the present invention.

FIG. 2A shows a cross-section of an integrated circuit IR sensor chip 1A which includes silicon substrate 2 and an etched cavity 4 therein. Silicon substrate 2 in FIG. 2A typically includes a thin layer of epitaxial silicon into which cavity 4 is etched, and also includes the silicon wafer substrate (not shown) on which the epitaxial silicon layer is grown. IR sensor chip 1A includes dielectric stack 3 (also referred to as $SiO_2$ stack 3) formed on the upper surface of silicon layer 2. $SiO_2$ stack 3 includes multiple oxide layers 3-1,2 . . . 6 as required to facilitate fabrication of N-doped polysilicon (polycrystalline silicon) layer 13, titanium nitride layer 15, tungsten contact layers 14-1, 14-2, 15-1, 15-2, and 17, first aluminum metallization layer M1, second aluminum metallization layer M2, third aluminum metallization layer M3, and various elements of CMOS circuitry (not shown), all within $SiO_2$ stack 3.

The various layers shown in dielectric stack 3, including polysilicon (i.e., polycrystalline silicon) layer 13, titanium nitride layer 15, aluminum first metallization layer M1, aluminum second metallization layer M2, and aluminum third metallization layer M3, each are formed on a corresponding oxide sub-layer of dielectric stack 3. Thermopile 7,8 thus is formed within $SiO_2$ stack 3. Cavity 4 in silicon layer 2 is etched directly beneath thermopile junction 7, and therefore thermally insulates thermopile junction 7 from silicon layer 2. However thermopile junction 8 is located directly adjacent to silicon layer 2 (and therefore is at essentially the same temperature as silicon layer 2). A relatively long, narrow polysilicon trace 13 is disposed on a $SiO_2$ sub-layer 3-1 of dielectric stack 3 and extends between tungsten contact 14-2 (in thermopile junction 7) and tungsten contact 14-1 (in thermopile junction 8). Titanium nitride trace 15 extends between tungsten contact 15-1 (in thermopile junction 8) and tungsten contact 15-2 (in thermopile junction 7). Thus, polysilicon trace 13 and titanium nitride trace 15 both function as parts of thermopile 7,8.

The right end of polysilicon layer 13 is connected to the right end of titanium nitride trace 15 by means of tungsten contact 14-2, aluminum trace 16-3, and tungsten contact 15-2 so as to form "hot" thermopile junction 7. Similarly, the left end of polysilicon layer 13 is connected by tungsten contact 14-1 to aluminum trace 11B and the left end of titanium nitride trace 15 is coupled by tungsten contact 15-1, aluminum trace 16-2, and tungsten contact 17 to aluminum trace 11A, so as to thereby form "cold" thermopile junction 8. The series-connected combination of the two thermopile junctions 7 and 8 forms thermopile 7,8.

Aluminum metallization interconnect layers M1, M2, and M3 are formed on the $SiO_2$ sub-layers 3-3, 3-4, and 3-5, respectively, of dielectric stack 3. A conventional silicon nitride passivation layer 12 is formed on another oxide sub-layer 3-6 of dielectric layer 3. A number of relatively small-diameter etchant holes 24 extend from the top of passivation layer 12 through dielectric stack 3 to cavity 4, between the various patterned metallization (M1, M2 and M3), titanium nitride, and polysilicon traces which form thermopile junctions 7 and 8. As subsequently explained, silicon etchant is introduced through etchant holes 24 to etch cavity 4 into the upper surface of silicon substrate 2. Note, however, that providing the etchant openings 24 is not conventional in standard CMOS processing or bipolar integrated circuit processing, nor is the foregoing silicon etching conventionally used in this manner in standard CMOS processing or bipolar integrated circuit processing.

One or more optional "deep trench" $SiO_2$ pillars 25 may be provided within cavity 4, extending from the bottom of cavity 4 to engage and support the bottom of the portion of dielectric membrane 3 extending over cavity 4.

The relatively small, round diameters of etchant holes 24 are selected in order to provide a more robust floating thermopile membrane over cavity 4 and hence a more robust IR radiation sensor. The diameters of the etchant hole openings 24 may vary from 10 microns to 30 microns with a spacing ratio of 4:1 maximum to 2:1. The spacings between the various etchant openings 24 may be in a range from approximately 10 to 60 microns. A smaller spacing ratio (i.e., the distance between the edges of the etchant openings 24 divided by the diameter thereof) has the disadvantage that it results in lower total thermopile responsivity, due to the packing factor (the number of thermopile junctions per square millimeter of surface area) of the many thermopile junctions of which thermopile junctions 7 and 8 are composed, respectively. However, a smaller spacing ratio results in a substantially faster silicon etching time. Therefore, there is a trade-off between the robustness of the membrane and the cost of etching of cavity 4. The use of optional $SiO_2$ pillars 25 allows the use of larger spacing between the etchant openings 24, due to the additional membrane robustness achieved by use of $SiO_2$ pillars 25. The use of optional $SiO_2$ pillars 25 also allows the maximum size of cavity 4 to be increased.

Figure 2B:
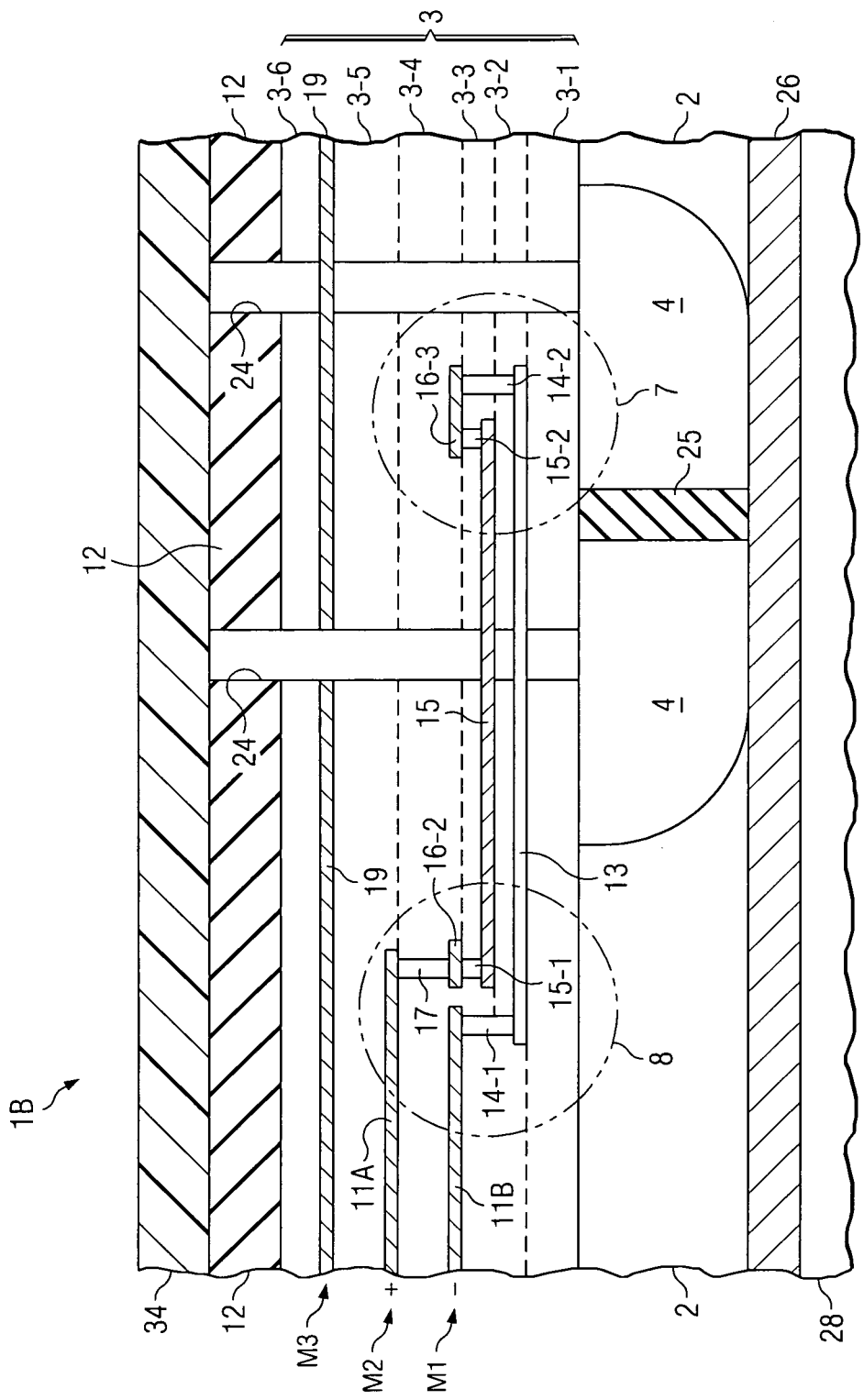
FIG. 2B is a section view of an IR sensor chip according to the present invention, formed on an SOI (silicon-on-insulator) substrate.

The IR sensor 1B shown in FIG. 2B is the same as the IR sensor 1A shown in FIG. 2A except that the structure 1B in FIG. 2B is formed on an SOI (silicon-on-insulator) substrate structure instead of on a thick silicon wafer substrate. SOI technology is well-known and therefore is not described in detail, except to note that in FIG. 2B the silicon layer 2 is supported on an insulative layer 26 which provided on a suitable substrate 28. Cavity 4 is etched through silicon layer 2 all the way to the upper surface of insulative layer 26, exposing the previously deposited $SiO_2$ material into a deep trench in silicon layer 2. $SiO_2$ pillar 25 extends from the upper surface of insulative layer 26 to the top surface of silicon layer 2, as subsequently described in more detail.

A roll-on epoxy film 34 may be provided on nitride passivation layer 12 in FIGS. 2A and 2B to permanently seal the upper ends of etchant openings 24 and to help reinforce the "floating membrane" portion of dielectric layer 3 Although there may be some applications of the invention which do not require epoxy cover plate 34, the use of epoxy cover plate 34 is an important aspect of providing a reliable WCSP package configuration of the IR sensors as described in the above mentioned Meinel et al. application. In an embodiment of the invention under development, epoxy cover plate 34 is substantially thicker (roughly 16 microns) than the entire thickness (roughly 6 microns) of dielectric stack 3.

Figure 3:
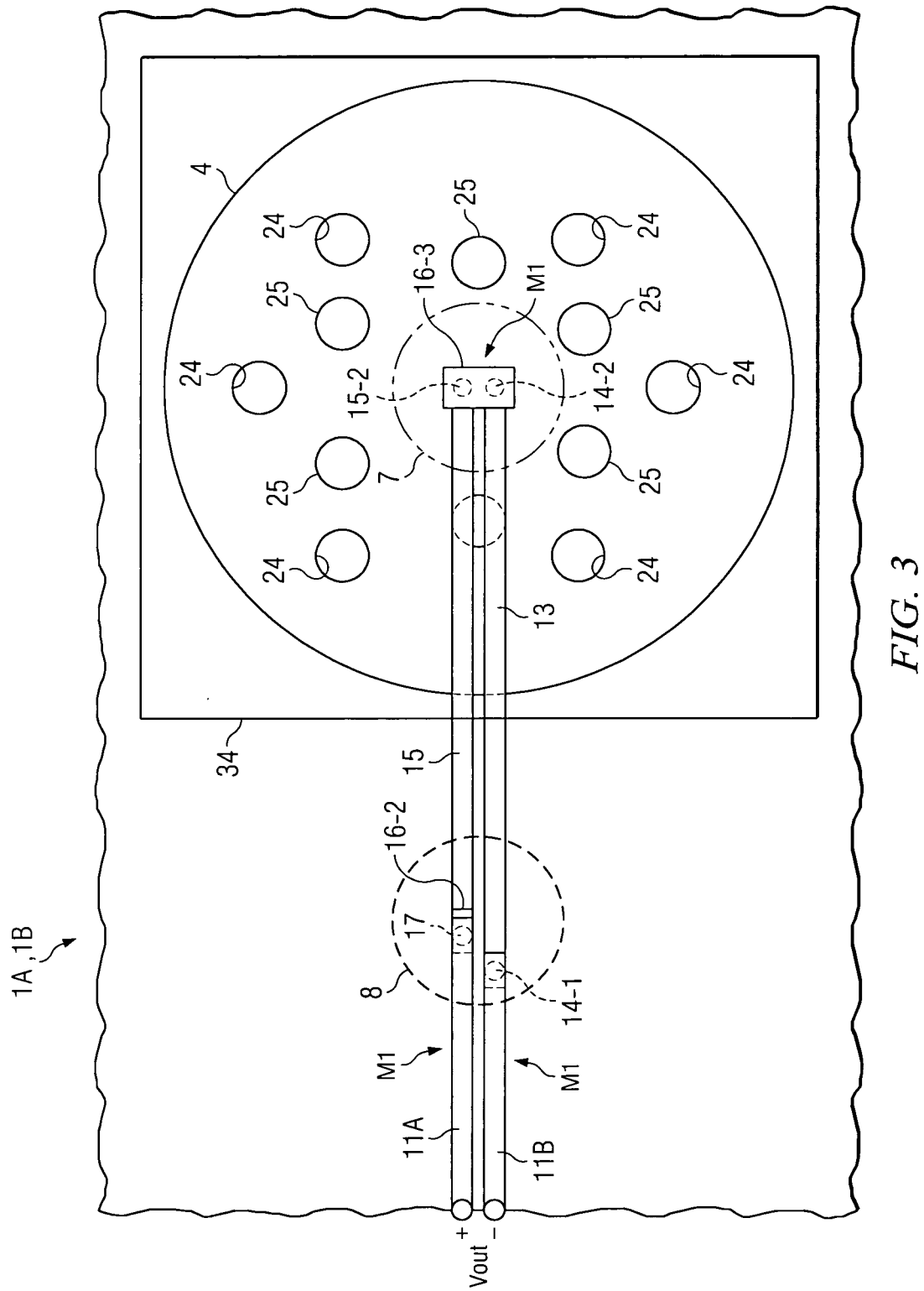
FIG. 3 is a transparent plan view of the IR sensor chip shown in FIG. 2A showing the relative alignment of various parts therein.

FIG. 3 shows an approximate "transparent" plan view of the portions of the IR sensors 1A and 1B shown in FIGS. 2A and 2B, respectively, to illustrate relative locations of a number of $SiO_2$ pillars 25, a number of etchant openings 24, thermopile junction 7, and thermopile junction 8. In this example, six $SiO_2$ pillars 25 are symmetrically located around thermopile junction 7, extending from the bottom of cavity 4 to six corresponding areas of the bottom surface of dielectric layer 3. Note that the number of etchant openings 24 may be many more than illustrated. For example, there may be roughly 25 to roughly 144 etchant openings 24. Typically, it would be more convenient to apply cover plate 34 to the entire top surface of passivation layer 12, although it could be applied to cover just the area above cavity 4 as shown in subsequently described FIG. 7A.

Figure 4:
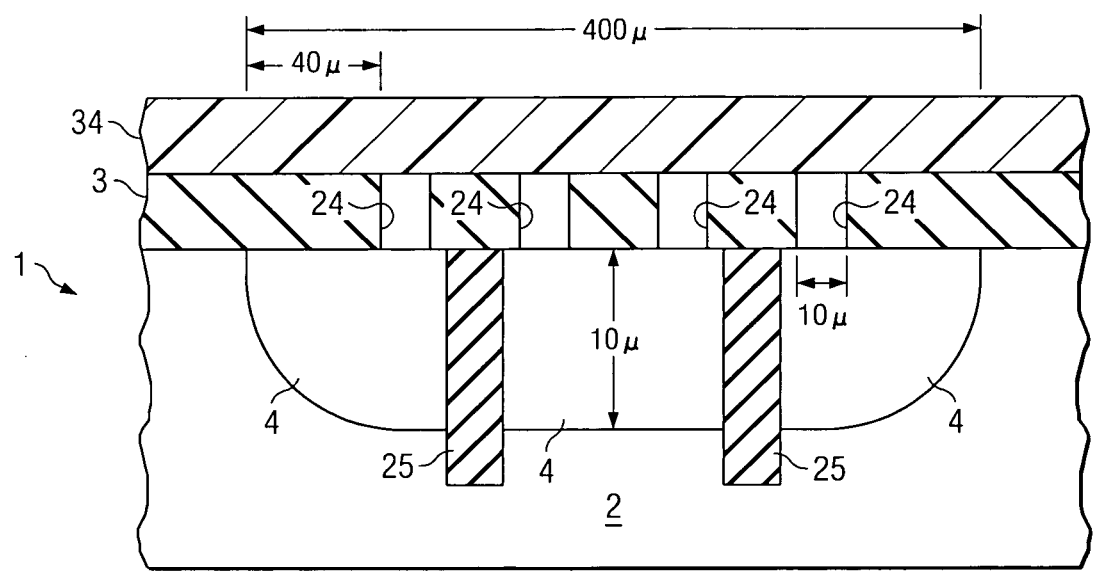
FIG. 4 is a more generalized section view diagram of the IR sensor as in FIG. 2A, indicating various minimum dimensions of one embodiment thereof.

FIG. 4 illustrates minimum dimensions, in microns, of the various features of cavity 4 and the "floating" membrane portion of dielectric layer 3 which supports thermopile junction 7 above cavity 4 for an embodiment of the invention presently under development. In that embodiment the etchant openings 24 are at least 10 microns ($\mu$) in diameter and are spaced at least approximately 10 microns apart. The span of cavity 4 can be about 400 microns, and its depth is at least 10 microns. The diameters of $SiO_2$ pillars 25 are at least 0.5 microns in diameter, and are spaced at least 10 microns from any of etchant openings 24 and at least 10 microns from thermopile junction 7.

The differential voltage Vout generated between (−) conductor 11B and (+) conductor 11A can be applied to the input of CMOS circuitry (not shown) located on the same chip or on a different chip.

The presence of cover plate 34 in FIGS. 2A and 2B, the thickness of which may be comparable to or greater than the thickness of dielectric layer 3, further strengthens the floating membrane portion of dielectric stack 3.

FIGS. 5A-5D show a sequence of section view diagrams of the IR sensor structures generated according to the process for fabricating the IR sensor chips of FIGS. 2A and 2B.

Figure 5A:
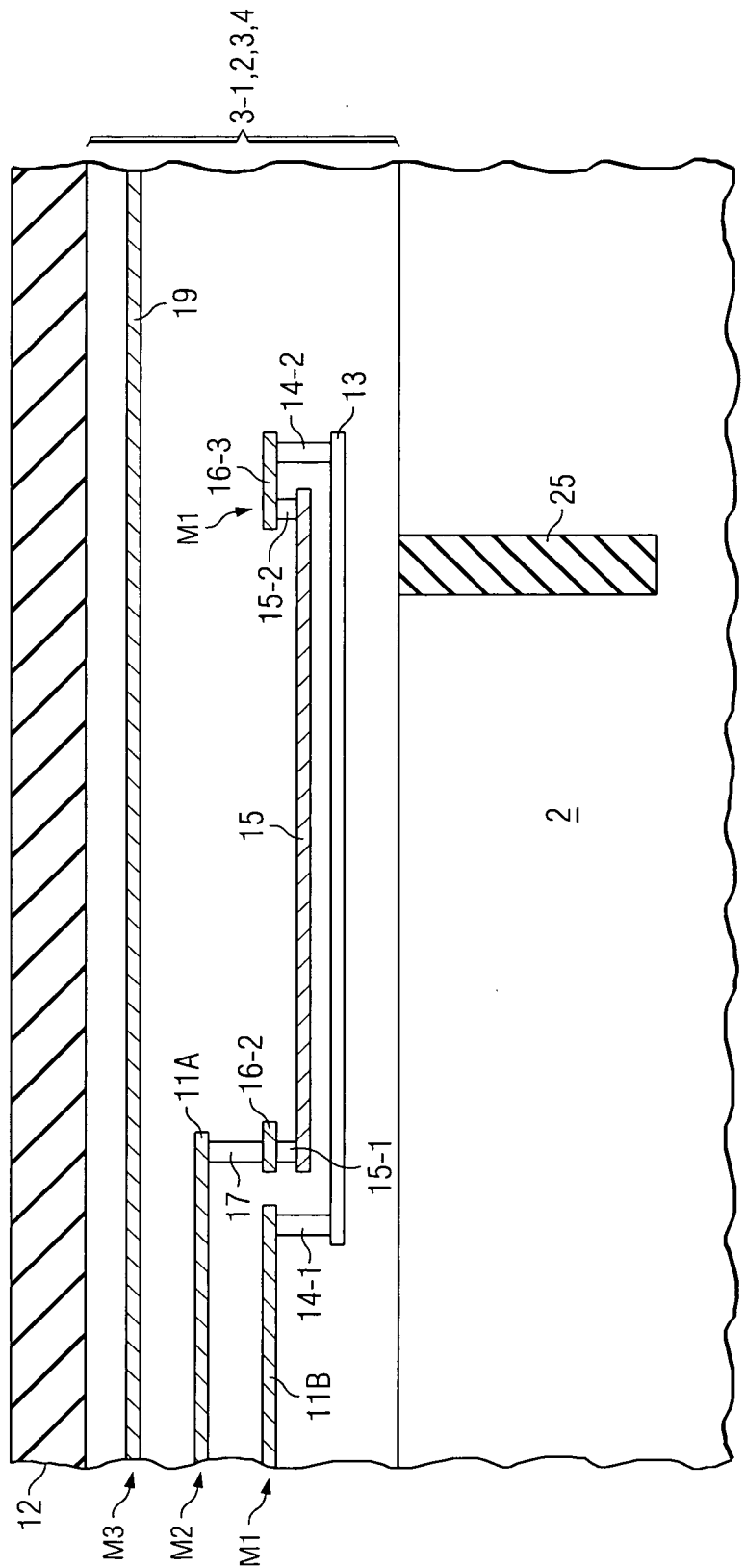
FIGS. 5A-5D show a sequence of section view diagrams of the IR sensor of FIG. 3 as it is being fabricated.

The process for forming the structure shown in FIG. 5A is described in detail in the assignee's pending application "SILICON DIOXIDE CANTILEVER SUPPORT AND METHOD FOR SILICON ETCHED STRUCTURES", Ser. No. 12/454,257, filed May 14, 2009 by Meinel et al., and incorporated herein by reference. As indicated in FIG. 5A, another $SiO_2$ sub-layer 3-5 (see FIGS. 2A and 2B) is deposited on the aluminum metallization M2. A third aluminum metallization layer M3, designated by reference numeral 19, is formed on sub-layer 3-5 and patterned as needed. Then a final $SiO_2$ sub-layer 3-6 is deposited on the M3 metallization to complete the structure of $SiO_2$ dielectric stack 3. Then, a silicon nitride passivation layer 12 is formed on dielectric sub-layer 3-6.

Figure 5B:
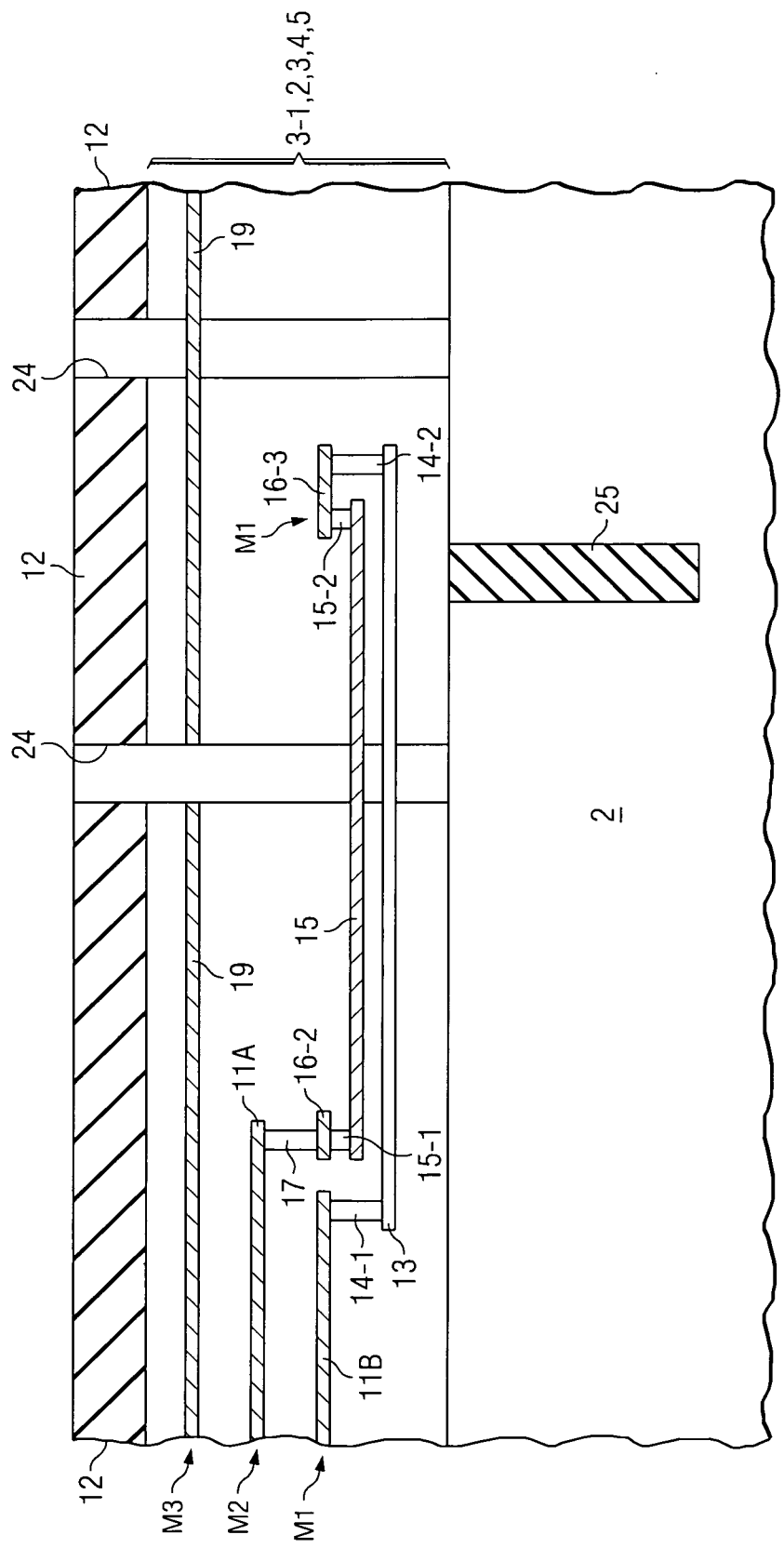
Figure 5C:
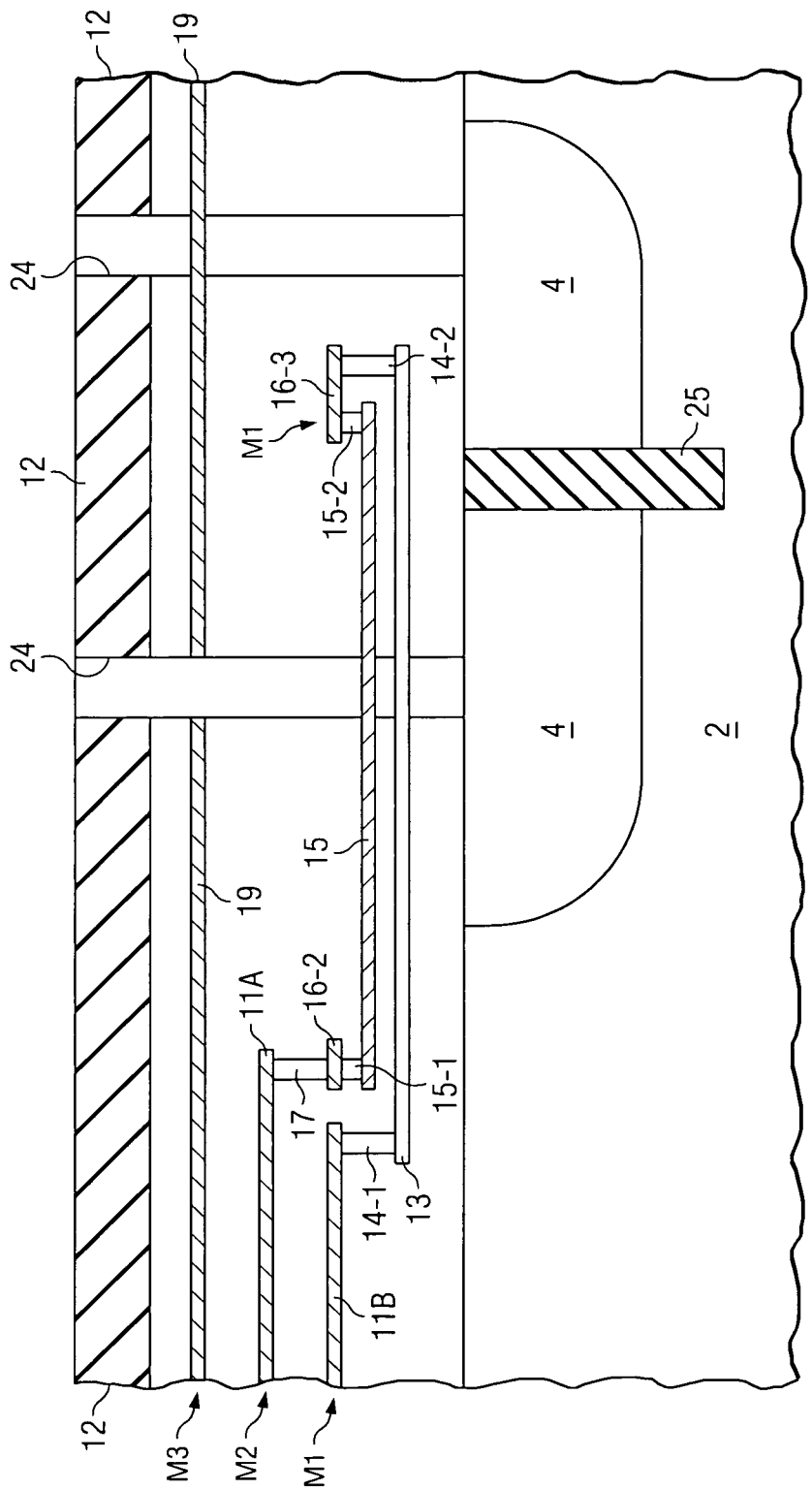

Next, as indicated in FIG. 5B, silicon etchant openings 24 are formed, extending from the upper surface of silicon substrate 2 to the top surface of passivation layer 12. Then, as indicated in FIG. 5C, a conventional isotropic silicon etchant is introduced into etchant openings 24 in order to etch cavity 4 in the upper surface of silicon substrate 2 so that cavity 4 has a shape determined by the locations of the various etchant openings 24. Since the silicon etchant used to etch cavity 4 does not attack $SiO_2$, more and more of the optional $SiO_2$ material 25, if utilized, is exposed as the silicon etching progresses. Therefore, after cavity 4 has been completely etched, deep trench $SiO_2$ pillar 25 extends from the bottom of cavity 4 all the way up to engage the bottom of dielectric layer 3. The portion of thin dielectric stack 3 extending over cavity 4 and containing etchant openings 24 and thermopile junction 7 thus becomes a more robust "floating" thermopile membrane which is thermally isolated by cavity 4 from silicon substrate 2.

Figure 5D:
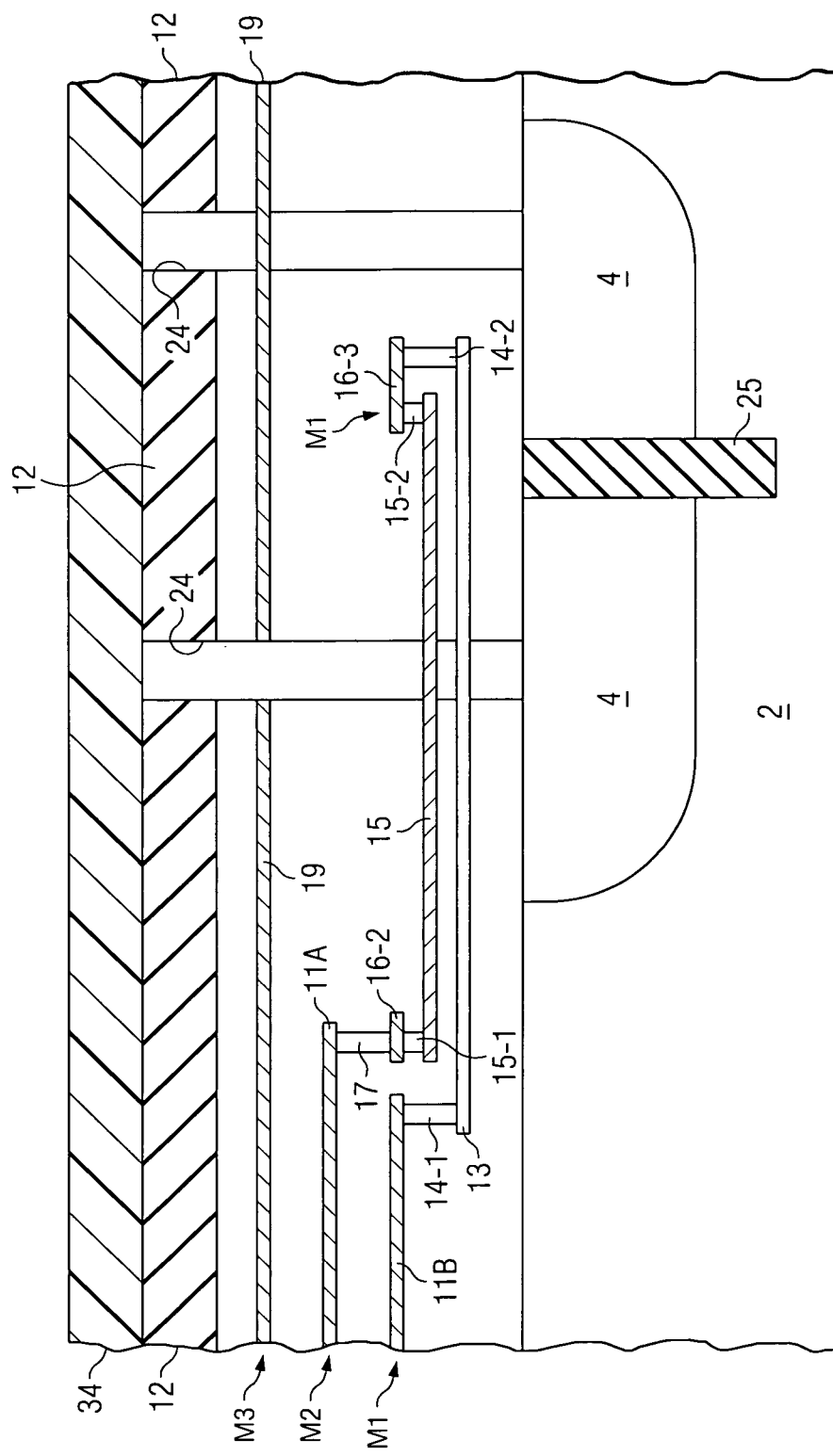

Finally, as indicated in FIG. 5D, a relatively thick (e.g., 8 to 24 microns thick) roll-on epoxy film or other suitable permanent cap layer 34 is provided on at least part of the upper surface of silicon nitride passivation layer 12 in order to permanently seal cavity 4 and etchant openings 24 and also to substantially strengthen the "floating" portion of dielectric membrane 3. This is desirable, especially if $SiO_2$ pillars 25 are not used, because a vigorous water stream impinges on the surface of IR sensor chip 1 during subsequent wafer sawing operations and would tend to crush the "floating" thermopile membrane over cavity 4. Cap layer 34 also prevents silicon residue generated by the wafer sawing operations from entering cavity 4.

The size, shape, spacing, and number of etchant openings 24 may be selected as described below to optimize the strength of the "floating" thermopile membrane above cavity 4, so as to provide a more robust IR radiation sensor device. The epoxy cover plate 34 preferably is placed over the sensor to seal cavity 4 and further strengthen the floating membrane portion of dielectric layer 3 containing thermopile junction 7.

In accordance with the present invention, it has been found that the diameters of etchant openings 24 can be increased in order to achieve faster silicon etching. Also, the "pitch", i.e., the distance between etchant openings 24, can be decreased in order to achieve faster silicon etching and hence lower manufacturing cost. The silicon etching time is a fairly linear function of the desired cavity depth, and also is a fairly linear inverse function of the cross-sectional area of the etchant openings 24. However, increasing of the diameters of etchant openings 24 and decreasing the pitch between adjacent etchant openings 24 also has the effect of making the $SiO_2$ membrane over cavity 4 weaker and less robust. Furthermore, increasing the diameters of etchant openings 24 and decreasing the pitch between them increases the final product cost by reducing the number of thermocouples junctions or high-frequency circuit elements that can be formed within the $SiO_2$ membrane over the etched cavity 4. Thus, it has been found that there is a trade-off between cost and robustness of integrated circuits including cavities etched in silicon by introducing silicon etchant through the $SiO_2$ membrane as described herein.

Figure 6A:
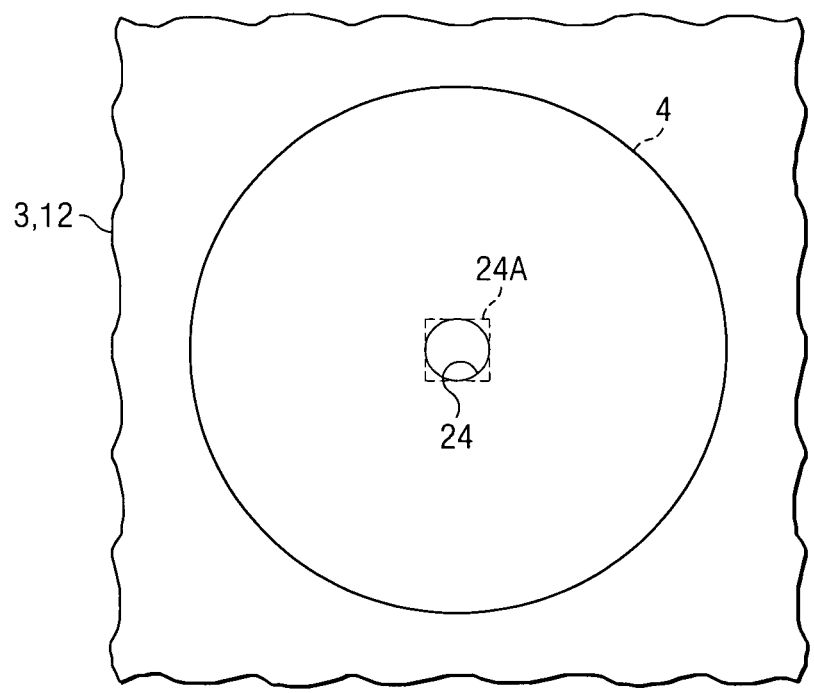
FIG. 6A is a transparent plan view of a single-etch cavity in the silicon of an integrated circuit.
Figure 6B:
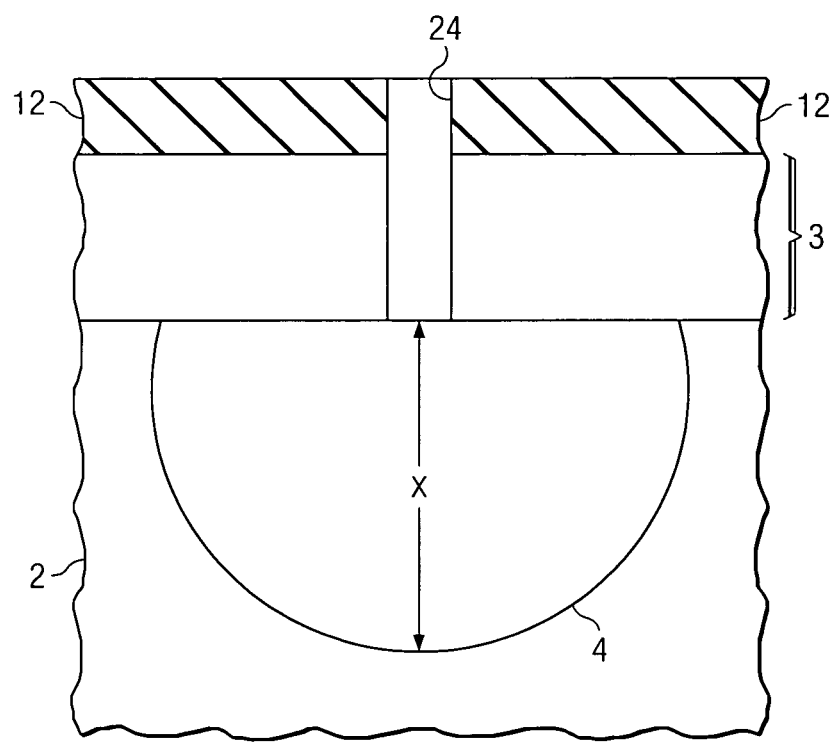
FIG. 6B is a section view of the single-etch cavity in FIG. 6A.

FIG. 6A shows a plan view indicating the circular boundary of a "single-etch" cavity 4 etched in silicon layer 2 $SiO_2$ layer 3 by introducing silicon etchant through a single circular etchant opening 24 through passivation layer 12 and $SiO_2$ layer 3. FIG. 6B shows a cross-section view of this structure, in which the depth of cavity 4 as indicated by X. This technique for etching cavity 4 through a single etchant opening theoretically provides the most accurate, sensitive achievable operation of an IR sensor thermocouple formed in $SiO_2$ layer 2 or theoretically provides the highest frequency operation of circuitry including one or more passive circuit elements such as a resistor, capacitor and/or conductor formed in $SiO_2$ layer 2. Using only one circular etchant opening to etch cavity 4 minimizes the stress in the portion of $SiO_2$ layer 2 forming a membrane over cavity 4. The silicon etchant is isotropic, so the depth of the etched cavity will be approximately equal to the width thereof.

Unfortunately, the single-etch structure illustrated in FIGS. 6A and 6B would result in the longest cavity etching times, and hence in unacceptably high product cost. To reduce cavity etching time, the diameter of the etchant opening 24 needs to be increased. (Note that although etchant openings 24 is shown as circular to minimize stress in the $SiO_2$ membrane, etchant openings 24 can be square (rectangular) to increase the cross-sectional area to achieve faster etching, at the expense of reduced membrane strength.)

Figure 6C:
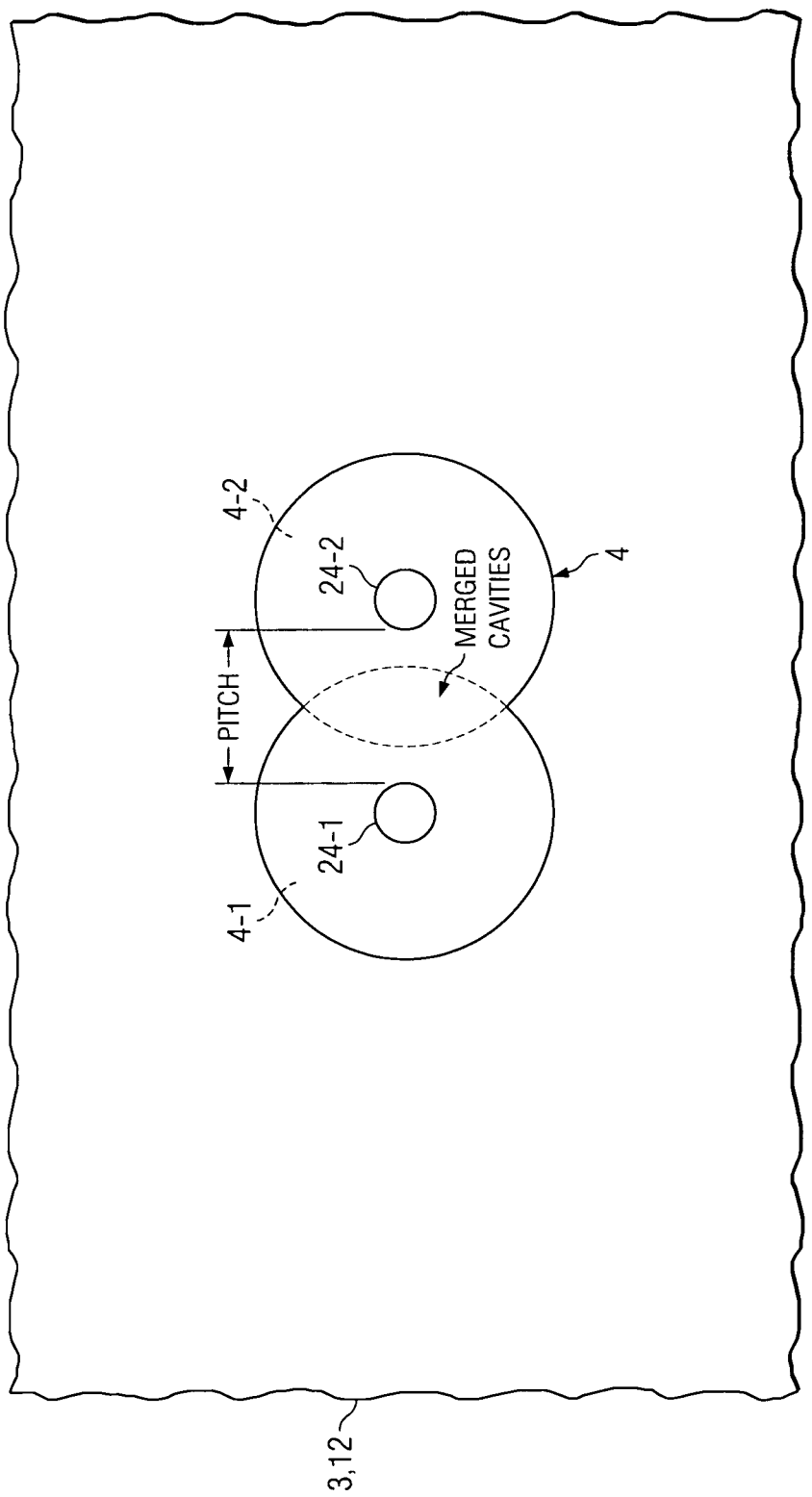
FIG. 6C is a transparent plan view of a "double-etch" composite cavity in the silicon layer of an integrated circuit.
Figure 6D:
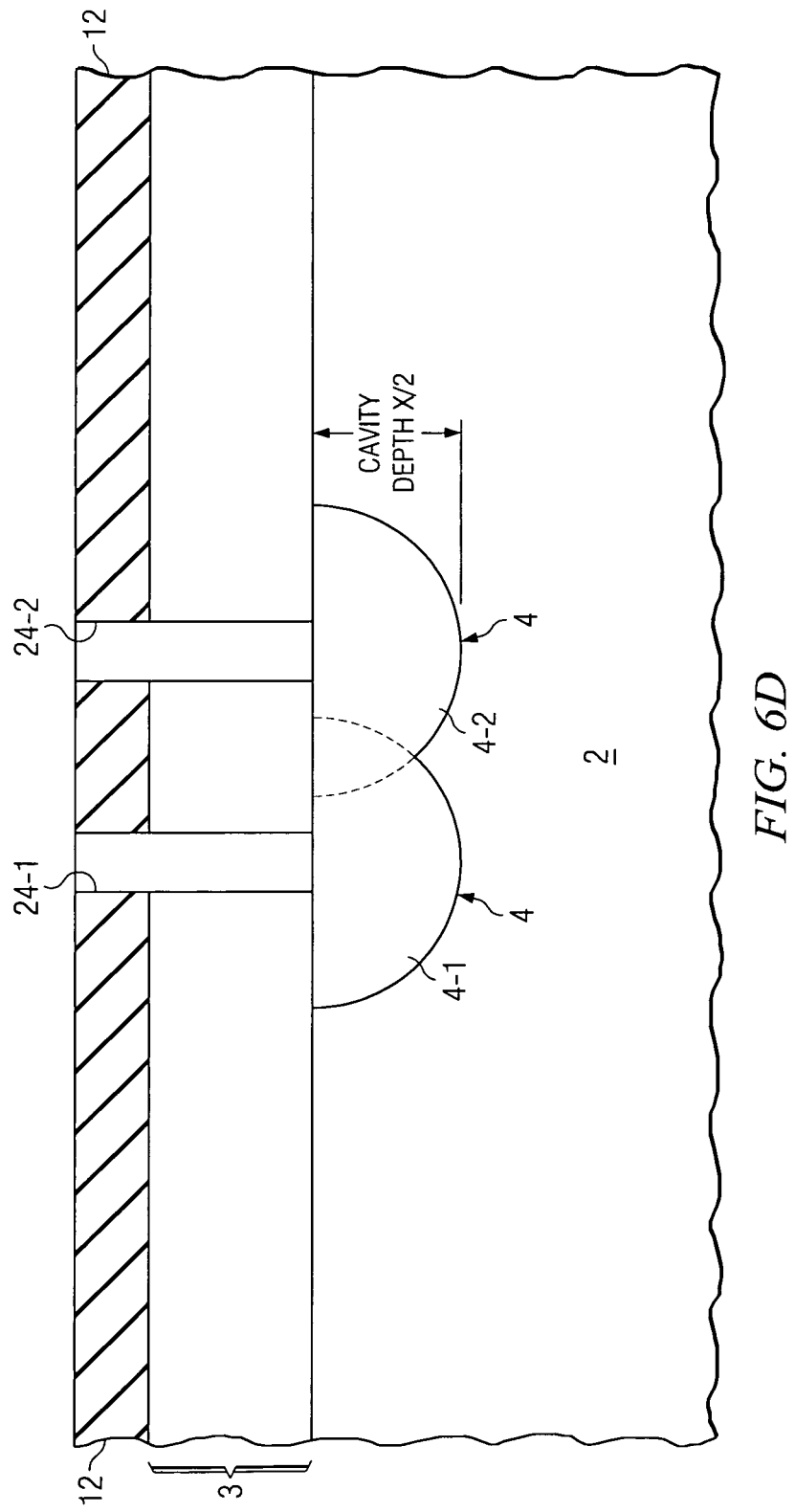
FIG. 6D is a transparent section view of the double-etch composite cavity in FIG. 6C.

To reduce the cavity etching time without unacceptably weakening the $SiO_2$ membrane, the present invention provides additional etchant openings 24 to simultaneously etch overlapping "sub-cavities" in silicon layer 2 in order to provide a larger "composite" cavity 4. FIG. 6C shows a plan view indicating boundaries of two sub-cavities 4-1 and 4-2 simultaneously etched in silicon layer 2 by introducing silicon etchant through separate corresponding circular etchant openings 24-1 and 24-2 through $SiO_2$ layer 3 and passivation layer 12, respectively, to provide a single composite cavity 4 under dielectric layer 3 and passivation layer 12, as also shown in the cross section view of FIG. 6D. In FIG. 6D, the depth of composite cavity 4 as indicated by X, to minimize cost by reducing etching time, the invention provides multiple etchant openings 24. Since the silicon etchant is isotropic, the depth of the etched composite cavity is approximately proportional to the composite cavity diameter (or distance across the composite cavity) divided by the number of etchant openings 24 through which silicon etchant is introduced. This technique for etching composite cavity 4 through multiple silicon etchant openings reduces the etching time to obtain composite cavity 4.

Figure 6E:
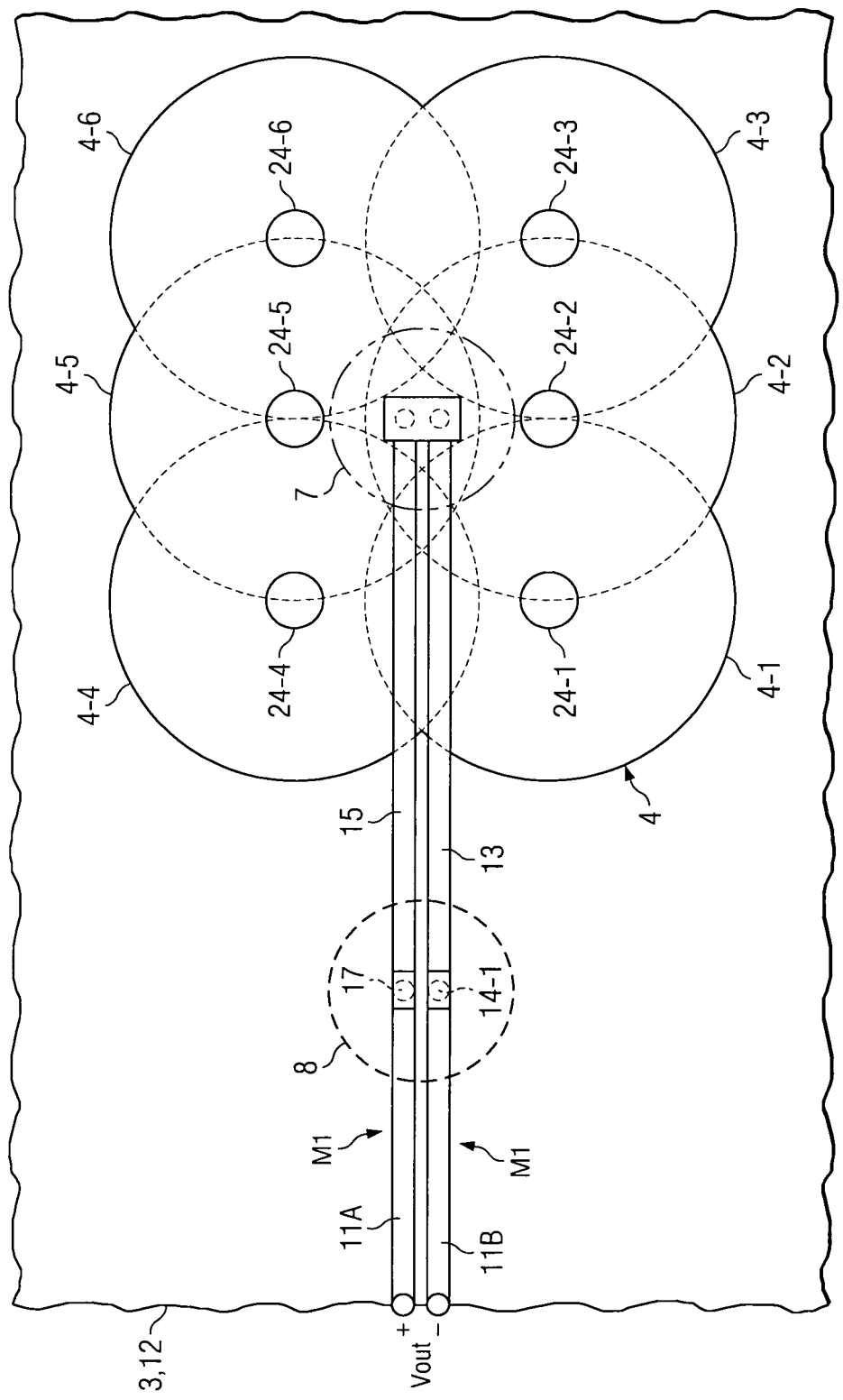
FIG. 6E is a transparent plan view of a "six-etch" composite cavity which can be used as the cavity 4 in FIG. 2A.

FIG. 6E shows a top view of a rectangular composite cavity 4 in which six sub-cavities 4-1,2 . . . 6 are simultaneously etched by introducing silicon etchant through six correspondent etchant openings 24-1,2 . . . 6, respectively. The trade-offs are cost of production versus the strength and robustness of the integrated circuit, especially its dielectric membrane. As a practical matter, at the present state of the art, the best trade-off in the design of the IR sensor shown in FIG. 2A is for the etchant hole diameter to be between approximately 10 and 30µ, the pitch or distance between etchant holes 24-1,2 . . . 6 to be between 2 and 4 times the etchant hole diameter, and for the cavity diameter to be between 50 and 400µ. In one embodiment of the invention, there are 5 rows and 5 columns of etchant openings.

Figure 6F:
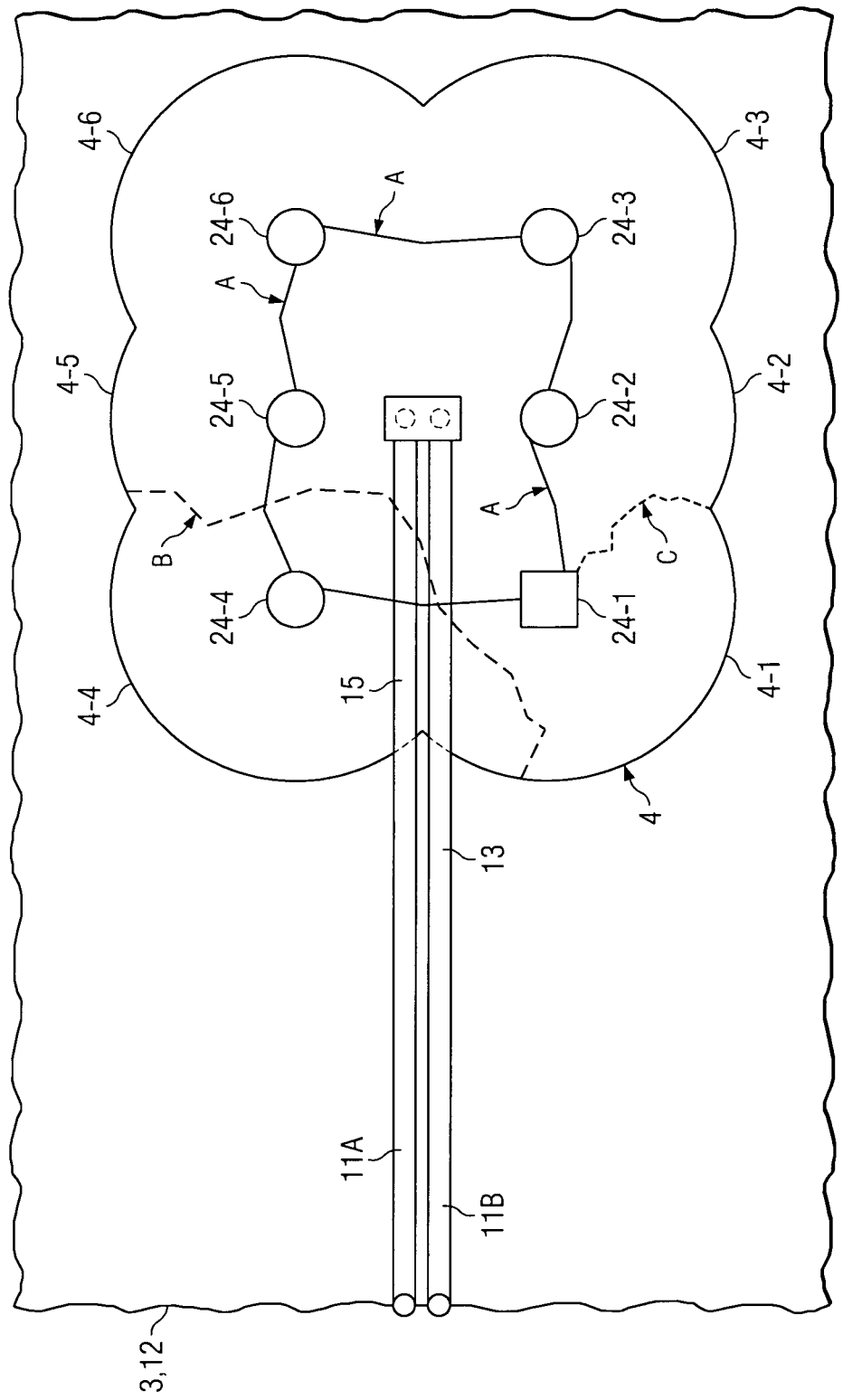
FIG. 6F is a transparent plan view illustrating possible failure modes of the prior art which are reduced/avoided by the present invention.

FIG. 6F shows a transparent plan view illustrating possible failure modes of the prior art which are reduced/avoided by the present invention. The various lines A extending between the various etchant openings 24-1,2 . . . 6 represents the $SiO_2$ cavitation forces which can occur during subsequent sawing of the wafer to obtain individual integrated circuit chips. The cavitation forces typically are caused by a stream of water directed at the wafer surface during wafer sawing, and may cause stresses at some locations which exceed the $SiO_2$ membrane strength. This can cause cracks along various paths in the $SiO_2$ membrane, one of which is indicated by line A. If a crack B, which could be caused by pressure on the surface, occurs in a portion of the $SiO_2$ membrane 3 supporting a metal trace such as titanium nitride conductor 15, the metal trace may be interrupted. This would result in a device failure or unreliable operation. In some cases, etchant openings might have corners, as in etchant opening 24-1 in FIG. 6F, from which corners stress induced cracks are more likely to propagate, as indicated by dotted line C. In the fragile dielectric membranes of the prior art, similar stresses are likely to cause cracks such as those indicated in FIG. 6F and cause device failures. The present invention reduces or avoids such cracks in $SiO_2$ membranes and resulting device failures by providing substantially stronger $SiO_2$ membranes over the etched cavities while also avoiding the long etching times and associated high cost that would be incurred by etching a single cavity using a single small etchant opening.

Figure 7A:
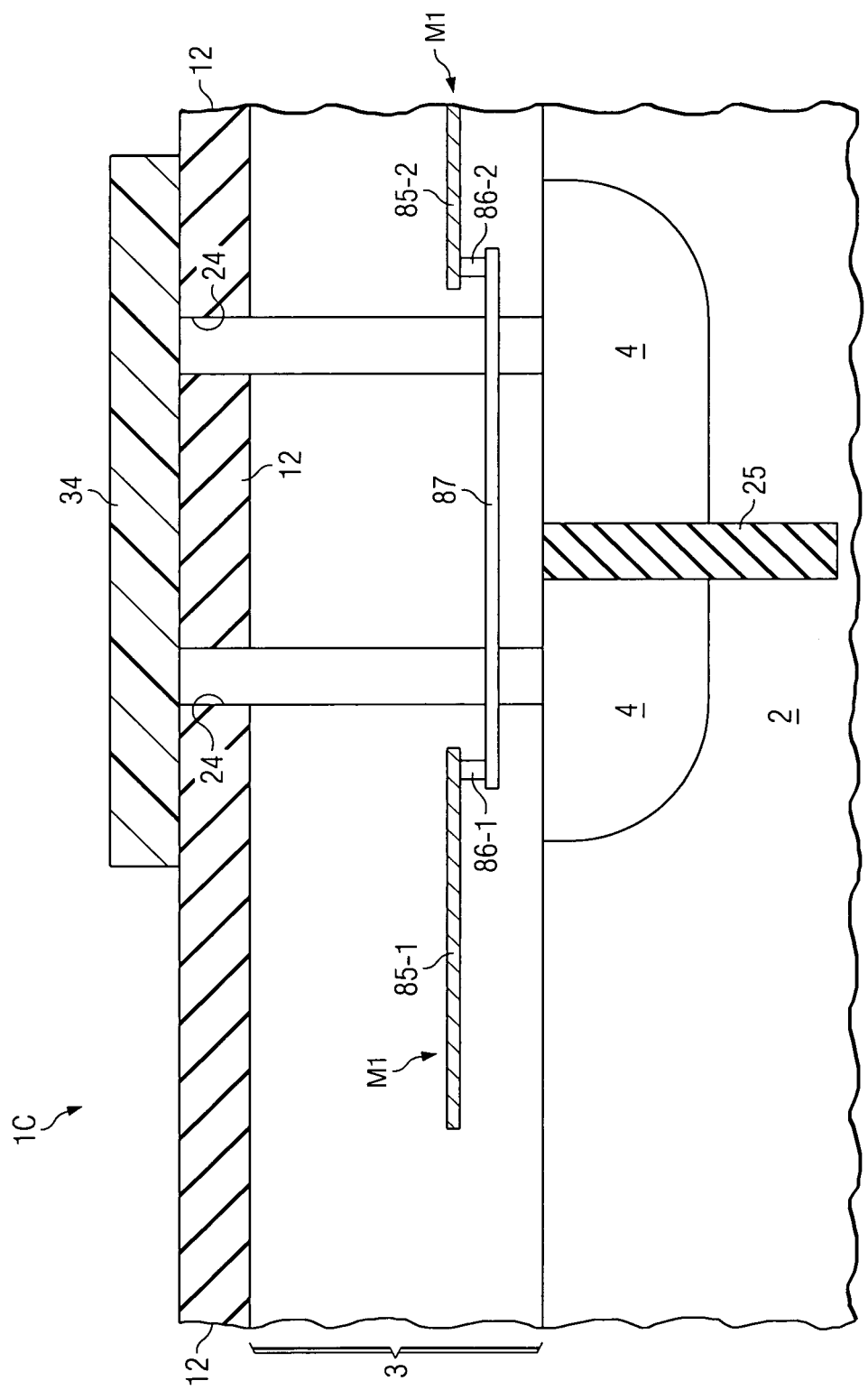
FIG. 7A is a section view of an integrated circuit of the present invention including a polycrystalline silicon resistor having very low resistor-to-substrate parasitic capacitance.
Figure 7B:
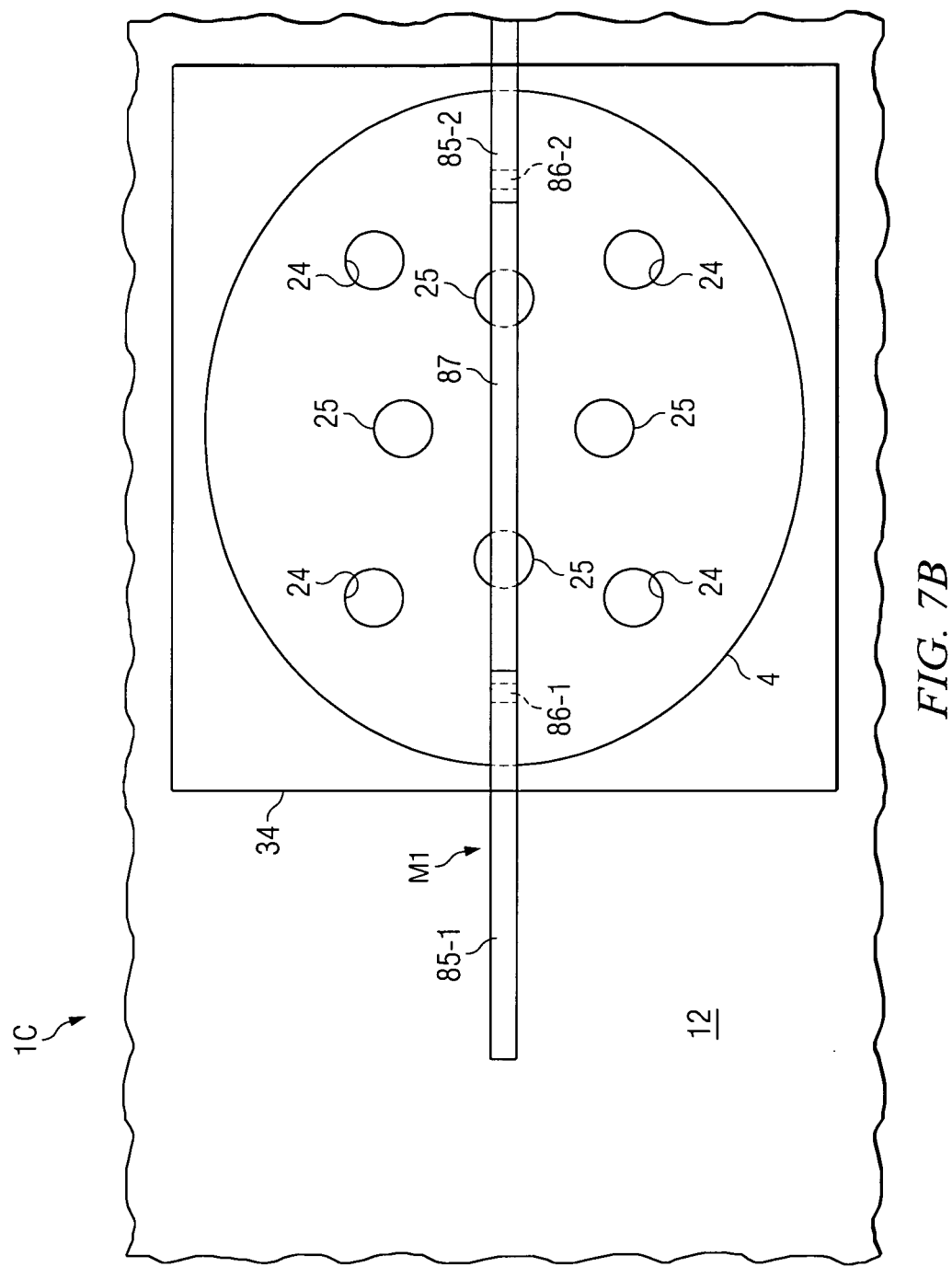
FIG. 7B is a transparent plan view of the integrated circuit shown in Fig. will 7A showing the relative alignment of various parts therein.

FIGS. 7A and 7B show simplified section view and plan view diagrams, respectively, of an embodiment of the present invention wherein the parasitic capacitance between a polysilicon resistor 87 and an epitaxial silicon layer or substrate 2 of an integrated circuit chip 1C is greatly reduced by providing cavity 4 in silicon layer 2 directly underneath resistor 87. In FIGS. 7A and 7B, silicon layer 2, cavity 4, $SiO_2$ pillar 25, a dielectric layer 3, passivation layer 12, etchant openings 24, and cover plate 34 may be substantially the same as in above described FIGS. 2A and 3 except that thermopile junctions 7 and 8 are omitted and instead an aluminum conductor 85-1 of the M1 metallization layer is connected by a tungsten contact 86-1 to one end of resistor 87 located directly above cavity 4. The other end of resistor 87 is connected by tungsten contact 86-2 to aluminum conductor 85-2 of the M1 metallization layer.

Since cavity 4 is filled with air (or gas or other material) having a much lower dielectric constant than $SiO_2$, the parasitic resistor-to-substrate capacitance between resistor 87 and substrate 2 is much lower than would be the case if cavity 4 were not provided between resistor 87 and silicon substrate 2. RF circuitry (not shown) containing poly silicon resistor 87 therefore may be operable at much higher frequency than if cavity 4 is not present (if the parasitic capacitance is the factor which actually limits the maximum RF frequency). As in the case of FIGS. 2A and 2B, the presence of $SiO_2$ pillars 25 results in a much stronger, more robust $SiO_2$ membrane extending over cavity 4.

Figure 8A:
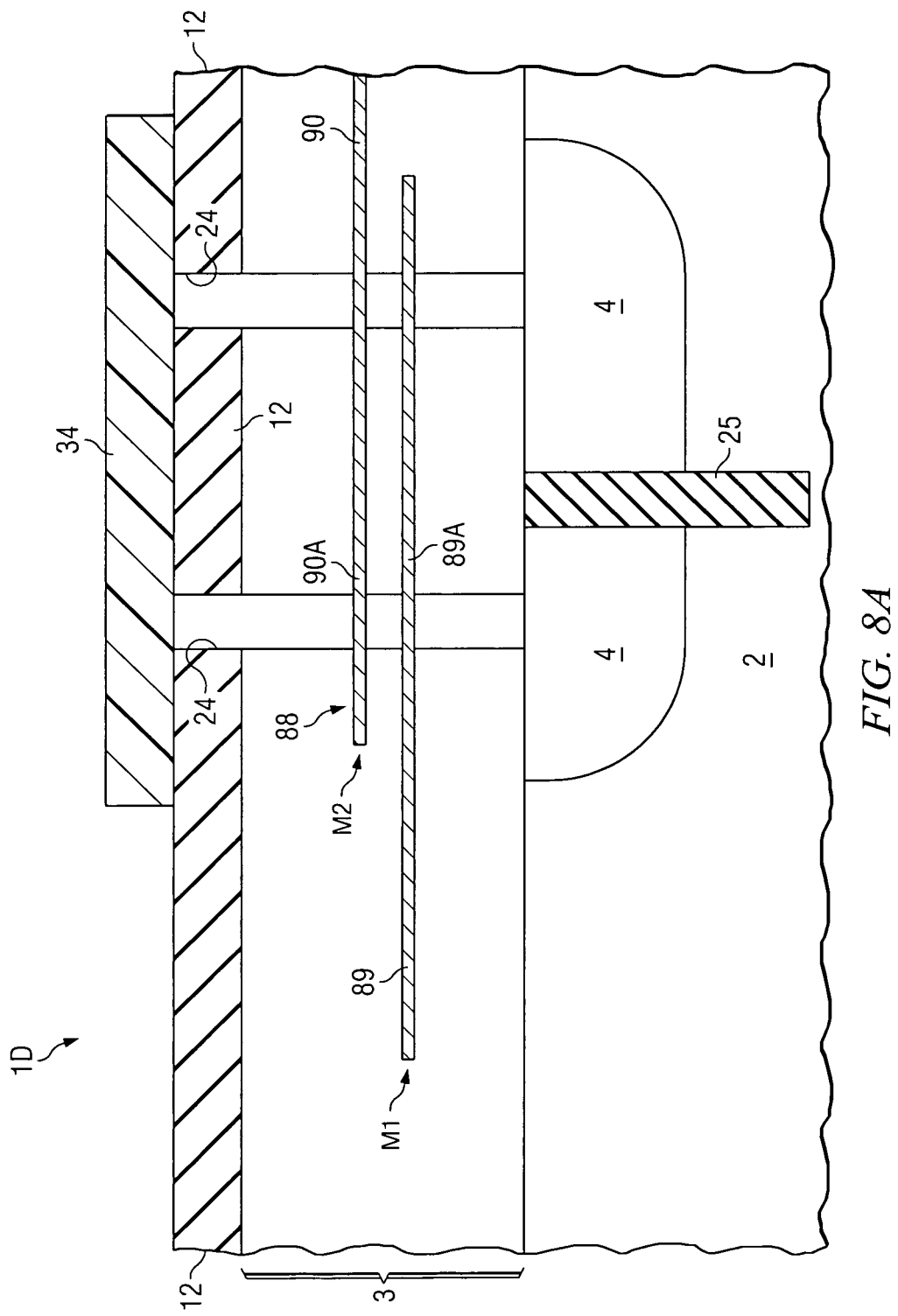
FIG. 8A is a section view of an integrated circuit of the present invention including a capacitor having very low capacitor-to-substrate parasitic capacitance.
Figure 8B:
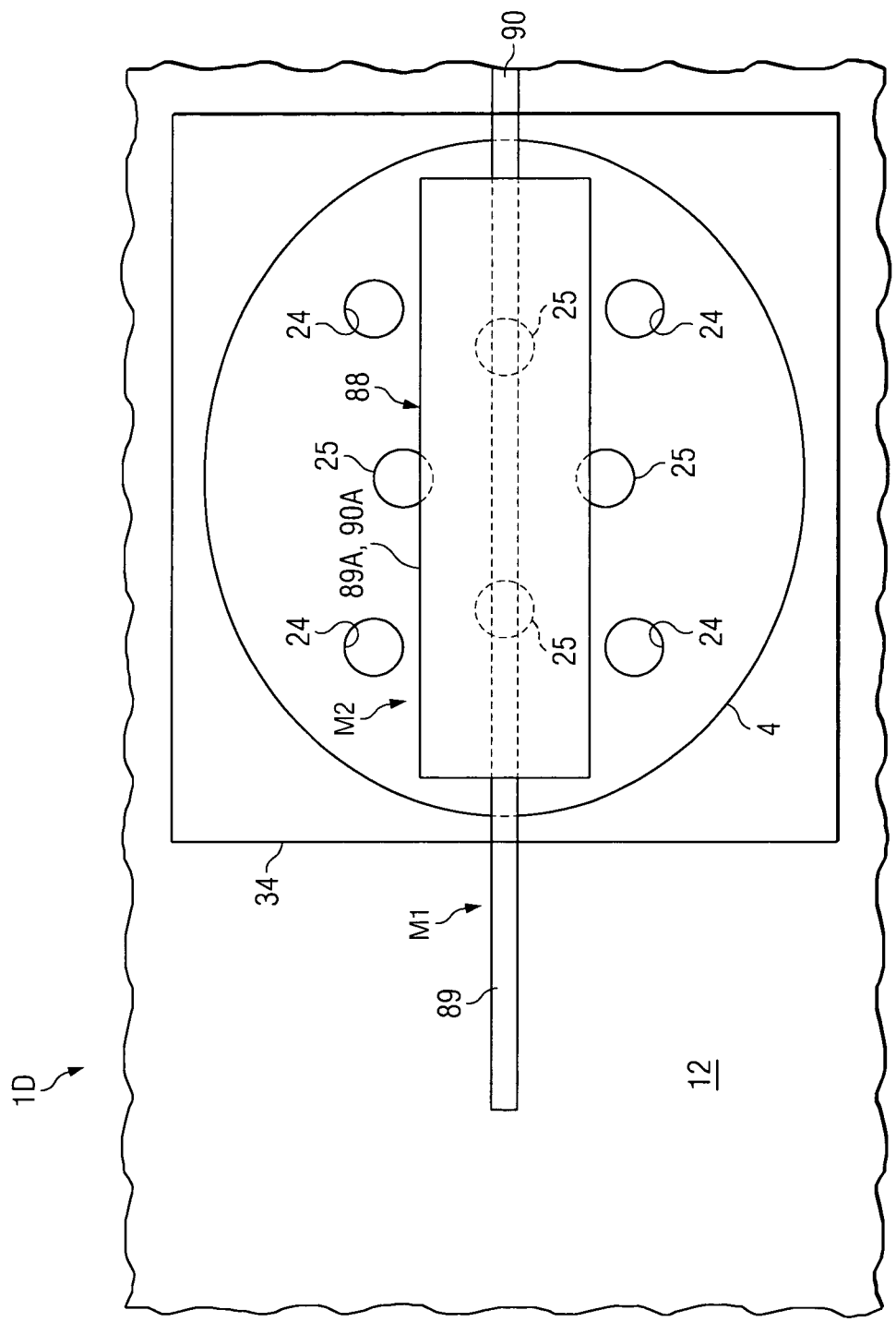
FIG. 8B is a transparent plan view of the integrated circuit shown in FIG. 8A showing the relative alignment of various parts therein.

FIGS. 8A and 8B show simplified section view and plan view diagrams, respectively, of an embodiment of the present invention wherein the parasitic capacitance between the lower plate of a capacitor 88 and the substrate 2 of integrated circuit 1D is greatly reduced by providing cavity 4 directly underneath capacitor 88. In FIGS. 8A and 8B, silicon layer 2, cavity 4, $SiO_2$ pillar 25, dielectric layer 3, passivation layer 12, etchant openings 24, and cover plate 34 may be substantially the same as in above described FIGS. 7A and 7B except that resistor 87 is omitted and instead is replaced by capacitor 88. Capacitor 88 includes an aluminum trace 89 of the M1 metallization layer connected to an enlarged aluminum lower capacitor plate 89A that is also formed in the M1 metallization layer. Capacitor 88 also includes an aluminum trace 90 of the M2 metallization layer connected to an enlarged aluminum upper capacitor plate 90A that is also formed in the M2 metallization layer. Lower capacitor plate 89A and upper capacitor plate 90A both are located directly above cavity 4. Therefore, the parasitic capacitor-to-substrate capacitance between capacitor 88 and silicon layer 2 is much lower than would be the case if cavity 4 were not provided between capacitor 88 and silicon substrate 2. RF circuitry (not shown) containing capacitor 88 therefore may be operable at much higher frequency than if cavity 4 is not present (if the parasitic capacitance actually is the factor which limits the maximum RF frequency).

Figure 9A:
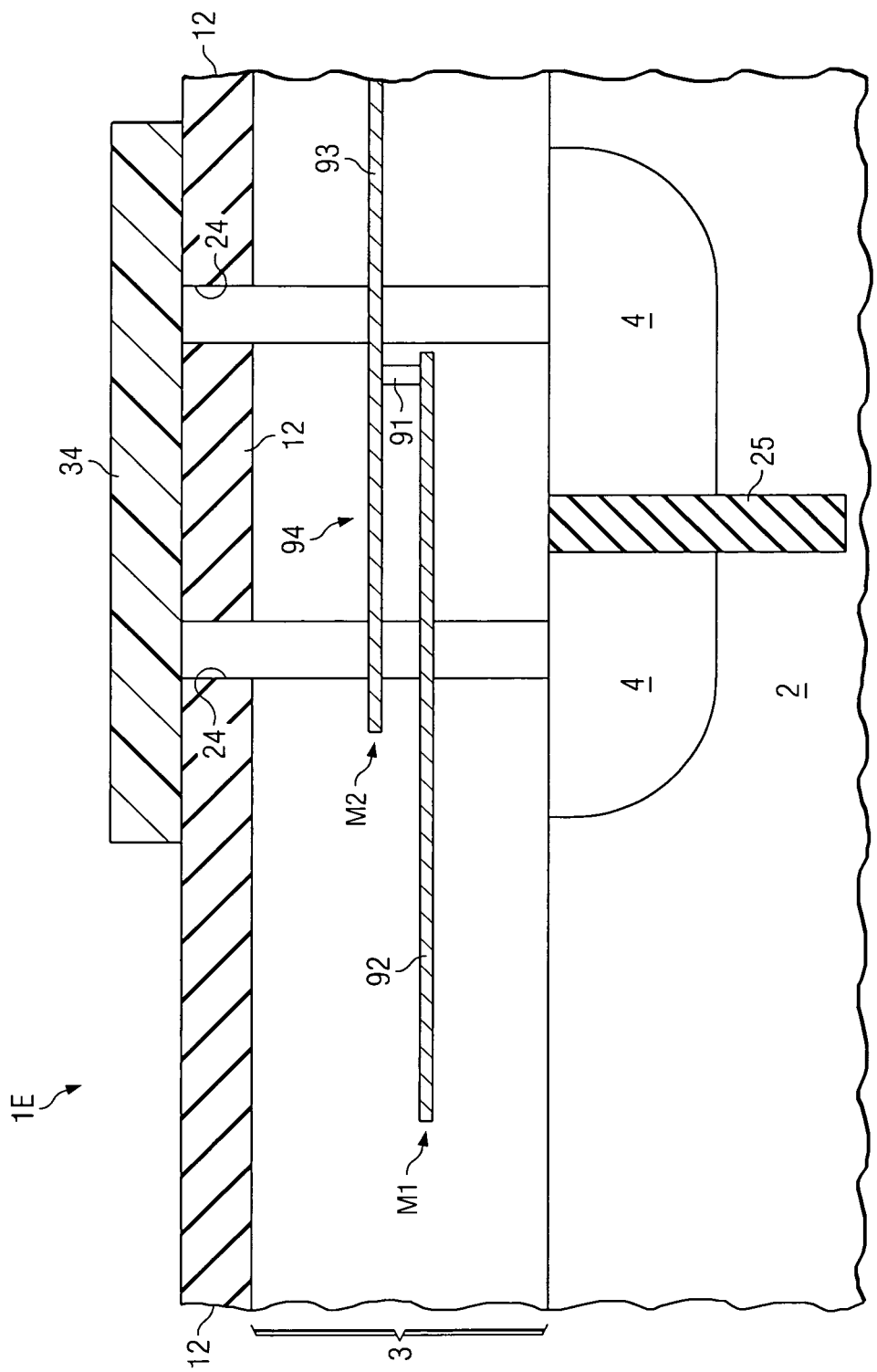
FIG. 9A is a section view of an integrated circuit of the present invention including an inductor having very low inductor-to-substrate parasitic capacitance.
Figure 9B:
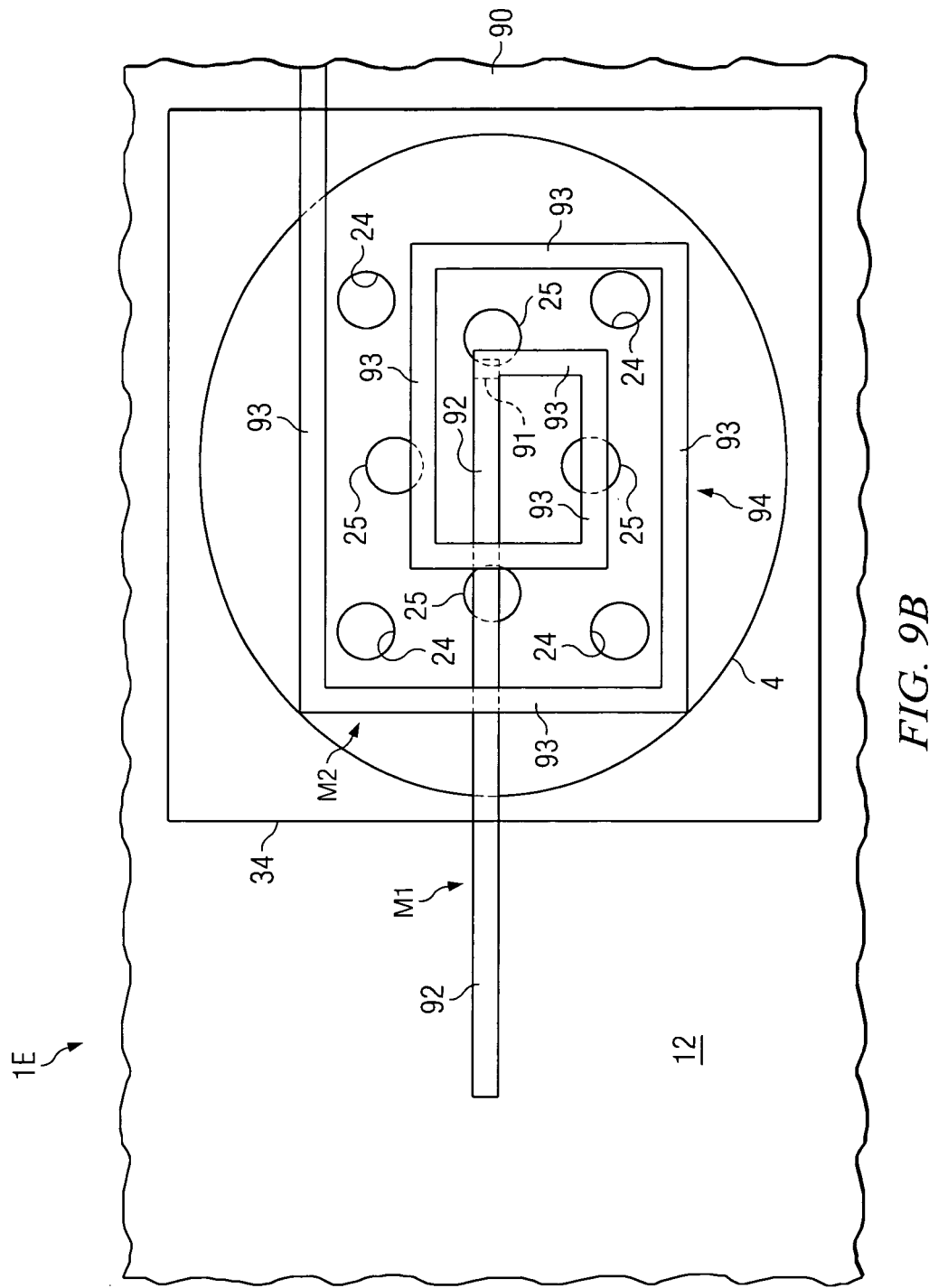
FIG. 9B is a transparent plan view of the integrated circuit shown in FIG. 9A showing the relative alignment of various parts therein.

FIGS. 9A and 9B show simplified section view and plan view diagrams, respectively, of an embodiment of the present invention wherein the parasitic capacitance between an inductor 94 and the substrate 2 of integrated circuit 1E is greatly reduced by providing cavity 4 directly underneath inductor 94. In FIGS. 8A and 8B, silicon substrate 2, cavity 4, $SiO_2$ pillar 25, dielectric layer 3, passivation layer 12, etchant openings 24, and cover plate 34 may be substantially the same as in above described FIGS. 7A and 7B except that resistor 87 is omitted and instead is replaced by inductor 94. Inductor 94 includes an aluminum trace 92 of the M1 metallization layer having an outer end connected to a first terminal of inductor 94 and an inner end connected by a tungsten contact 91 to an inner end of an aluminum trace 93 of the M2 metallization layer. Aluminum trace 93 forms one or more spiral loops and an outer end of aluminum trace 93 extends to a second terminal of inductor 94. Inductor 94 is located directly above cavity 4. Therefore, the parasitic capacitor-to-substrate capacitance between inductor 94 and substrate 2 is much lower than would be the case if cavity 4 were not provided between capacitor 88 and silicon substrate 2. RF circuitry (not shown) containing inductor 94 therefore may be operable at much higher frequency than if cavity 4 is not present (if the parasitic capacitance actually is the factor which limits the maximum RF frequency).

Thus, the invention provides multiple etchant openings, typically under 30 microns in diameter, in the $SiO_2$ membrane, to allow relatively fast etching of the cavity in the silicon layer, while at the same time providing maximum strength of the $SiO_2$ membrane. This is in contrast to the known prior art wherein the etchant openings having relatively large cross-sectional areas in order to achieve fast etching of the cavity, but no practical, cost-effective way of also achieving strength and robustness of the $SiO_2$ membrane over the cavity has been proposed.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, although the above described embodiments of the invention discloses a cavity etched into a silicon layer, that layer could be formed of other semiconductor material suitable for making integrated circuits. Although the dielectric layer 3 in the described embodiments of the invention is composed of SiO2, other dielectric materials, such as silicon nitride, could be used in some cases. Furthermore, the invention is applicable to bipolar integrated circuit technology, although CMOS integrated circuit structures are described herein.

What is claimed is:

1. An apparatus comprising:
   a semiconductor substrate;
   a dielectric stack formed over the semiconductor substrate, wherein the dielectric stack is a membrane;
   a first channel that extends through the dielectric stack;
   a second channel that extends through the dielectric stack and that is separated from the first channel;
   a first cavity that is formed in the semiconductor substrate by the introduction of an etchant through the first channel; and
   a second cavity that is formed in the semiconductor substrate by the introduction of an etchant through the second channel,
   wherein the first and second cavities overlap to at least partially form a composite cavity, wherein the first and second cavities are at least partially individually discernible sub-cavities, and
   wherein the composite cavity underlies at least a portion the dielectric stack.

2. The apparatus of claim 1, wherein the apparatus further comprises:
   a passivation layer formed over the dielectric stack, wherein the first and second channels extend through the passivation layer; and
   a cap layer formed over the passivation layer, wherein the cap layer seals the channel, wherein the cap layer is a roll-on epoxy film.

3. The apparatus of claim 2, wherein the dielectric stack further comprises:
   a first dielectric layer formed over the substrate;
   a polysilicon layer formed over the first dielectric layer, wherein cavity underlies at least a portion of the polysilicon layer;

a second dielectric layer formed over the polysilicon layer;
a nitride layer formed over the second dielectric layer, wherein cavity underlies at least a portion of the nitride layer;
a third dielectric layer formed over the nitride layer;
a metallization layer that is formed over the third dielectric layer, wherein the metallization layer includes a first portion, a second portion, and a third portion;
   a first via that extends between the polysilicon layer and the first portion of the metallization layer;
   a second via that extends between the nitride layer and the first portion of the metallization layer, wherein cavity underlies the first via, the second via, and the first portion of the metallization layer;
   a third via that extends between the polysilicon layer and the second portion of the metallization layer; and
   a fourth via that extends between the nitride layer and the third portion of the metallization layer.

4. The apparatus of claim 3, wherein the polysilicon layer is doped, and wherein the nitride layer is formed of titanium nitride, and wherein the metallization layer is formed of aluminum.

5. An apparatus comprising:
an silicon-on-insulator (SOI) substrate;
a silicon layer formed over the SOI substrate;
a dielectric stack formed over the silicon layer, wherein the dielectric stack is a membrane, the dielectric stack including:
   a first thermopile junction;
   a second thermopile junction that is spaced apart from the first thermopile junction; and
      an interconnect that is coupled to each of the first and second thermopiles;
a first channel that extends through the dielectric stack;
a second channel that extends through the dielectric stack and that is separated from the first channel;
a first cavity that is formed in the semiconductor substrate by the introduction of an etchant through the first channel; and
a second cavity that is formed in the semiconductor substrate by the introduction of an etchant through the second channel,
wherein the first and second cavities overlap to at least partially form a composite cavity,
wherein the first and second cavities are at least partially individually discernible sub-cavities, and
wherein the composite cavity underlies at least a portion the dielectric stack.

6. The apparatus of claim 5, wherein the dielectric stack further comprises:
a first dielectric layer formed over the silicon layer;
a polysilicon layer formed over the first dielectric layer;
a second dielectric layer formed over the polysilicon layer;
a nitride layer formed over the second dielectric layer;
a third dielectric layer formed over the nitride layer; and
a metallization layer that is formed over the third dielectric layer.

7. The apparatus of claim 6, wherein the metallization layer further comprises a first portion, a second portion, and a third portion, and wherein the first thermopile junction further comprises:
   a portion of the polysilicon layer;
   a first via that extends between the portion of the polysilicon layer and the first portion of the metallization layer;
   a portion of the nitride layer; and
   a second via that extends between the portion of the nitride layer and the first portion of the metallization layer.

8. The apparatus of claim 7, wherein the portion of the polysilicon layer further comprises a first portion of the polysilicon layer, and wherein the portion of the nitride layer further comprises a first portion of the nitride layer, and wherein the second thermopile junction further comprises:
   a second portion of the polysilicon layer;
   a third via that extends between the second portion of the polysilicon layer and the second portion of the metallization layer;
   a second portion of the nitride layer; and
   a fourth via that extends between the second portion of the nitride layer and the third portion of the metallization layer.

9. The apparatus of claim 8, wherein the interconnect further comprises:
   a third portion of the polysilicon layer that is coupled to the first and second portions of the polysilicon layer; and
   a third portion of the nitride layer that is coupled to the first and second portions of the nitride layer.

10. The apparatus of claim 9, wherein the apparatus further comprises:
   a passivation layer formed over the dielectric stack, wherein the first and second channels extend through the passivation layer; and
   a cap layer formed over the passivation layer, wherein the cap layer seals the channel,
   wherein the cap layer is a roll-on epoxy film.

11. The apparatus of claim 5, wherein the dielectric stack further comprises:
a first dielectric layer formed over the silicon layer;
a polysilicon layer formed over the first dielectric layer;
   a second dielectric layer formed over the polysilicon layer.

* * * * *